(12) United States Patent
Harada et al.

(10) Patent No.: US 8,902,664 B2
(45) Date of Patent: Dec. 2, 2014

(54) SEMICONDUCTOR MEMORY DEVICE

(71) Applicant: Kabushiki Kaisha Toshiba, Tokyo (JP)

(72) Inventors: Yoshikazu Harada, Kanagawa-ken (JP); Masahiro Yoshihara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/845,732

(22) Filed: Mar. 18, 2013

(65) Prior Publication Data

US 2013/0314990 A1 Nov. 28, 2013

(30) Foreign Application Priority Data

May 22, 2012 (JP) .................. 2012-116322

(51) Int. Cl.
G11C 7/22 (2006.01)
G11C 16/10 (2006.01)

(52) U.S. Cl.
CPC ...................... *G11C 16/10* (2013.01)
USPC ............. 365/185.18; 365/185.02; 365/185.03

(58) Field of Classification Search
USPC ...................................... 365/185.03
See application file for complete search history.

(56) References Cited

U.S. PATENT DOCUMENTS

| 6,879,520 | B2 | 4/2005 | Hosono et al. |
| 7,859,898 | B2 | 12/2010 | Sato et al. |
| 2009/0040835 | A1 | 2/2009 | Ogawa |
| 2011/0170347 | A1 | 7/2011 | Shibata et al. |

FOREIGN PATENT DOCUMENTS

| JP | 2004-326866 A | 11/2004 |
| JP | 2007-184040 A | 7/2007 |
| JP | 2009-43357 A | 2/2009 |
| JP | 2011-146088 A | 7/2011 |

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

According to one embodiment, a control circuit applies a pass potential to a first word line and a preliminary read-out potential to a second word line. The control circuit reads data from a first memory cell transistor at a first condition in a case where a second memory cell transistor has been switched to an ON state and at a second condition in a case where the second memory cell transistor has been switched to an OFF state, by the applying of the preliminary read-out potential. The first condition enables the discrimination of a value of the first memory cell transistor in a case where the first memory cell transistor has a threshold in a relatively low distribution. The second condition enables the discrimination of the value of the first memory cell transistor in a case where the first memory cell transistor has a threshold in a relatively high distribution.

15 Claims, 19 Drawing Sheets

ERASE STATE

L PAGE PROGRAM

U PAGE PROGRAM

TIME

TIME

TIME

TIME

TIME

SEMICONDUCTOR MEMORY DEVICE

CROSS-REFERENCE TO RELATED APPLICATIONS

This application is based upon and claims the benefit of priority from the prior Japanese Patent Application No. 2012-116322, filed on May 22, 2012; the entire contents of which are incorporated herein by reference.

FIELD

Embodiments described herein relate generally to a semiconductor memory device.

BACKGROUND

In NAND flash memory which is one type of semiconductor memory device, data is programmed by changing the threshold of a memory cell transistor by storing a charge in a charge storage layer. On the other hand, the data that is programmed is read by applying a prescribed potential to the control electrode of the memory cell transistor and determining whether the memory cell transistor is in an ON state that allows a current to flow or is in an OFF state that does not allow the current to flow.

However, as the shrink of NAND flash memory progresses, the distance between the charge storage layers of mutually-adjacent memory cell transistors becomes short; adjacent cell coupling occurs; and the precision when reading the data decreases. On the other hand, a faster read-out operation is necessary in NAND flash memory.

DETAILED DESCRIPTION

In general, according to one embodiment, a semiconductor memory device includes a semiconductor substrate, a plurality of word lines, a plurality of bit lines, a source line, charge storage layers and a control circuit. A plurality of active areas are formed in the semiconductor substrate to extend in a first direction. The plurality of word lines are provided on the semiconductor substrate to extend in a second direction. The plurality of bit lines are connected respectively to the active areas. The source line is connected to the plurality of active areas. The charge storage layers are disposed between the active areas and the word lines. Memory cell transistors are formed at intersections between the active areas and the word lines. The memory cell transistors are configured to be programmed with data having values of multiple levels. The control circuit is configured to apply a pass potential to a first word line and apply a preliminary read-out potential to a second word line. The second word line is disposed adjacently to the first word line. The first word line is coupled with a first memory cell transistor of the memory cell transistors. The second word line is coupled with a second memory cell transistor of the memory cell transistors. The second memory cell transistor is programmed with data after the first memory cell transistor is programmed. The pass potential is configured to switch the memory cell transistors to an ON state regardless of the programmed value. The control circuit is configured to read the data from the first memory cell transistor at a first condition in a case where the second memory cell transistor has been switched to the ON state based on a value of the second memory cell transistor by the applying of the preliminary read-out potential. The first condition is configured to enable the discrimination of a value of the first memory cell transistor in a case where the first memory cell transistor has a threshold voltage in a relatively low distribution. The control circuit is configured to read the data from the first memory cell transistor at a second condition in a case where the second memory cell transistor has been switched to an OFF state by the applying of the preliminary read-out potential. The second condition is configured to enable the discrimination of a value of the first memory cell transistor in a case where the first memory cell transistor has a threshold voltage in a relatively high distribution.

Embodiments of the invention will now be described with reference to the drawings.

First, a first embodiment will be described.

Figure 1:
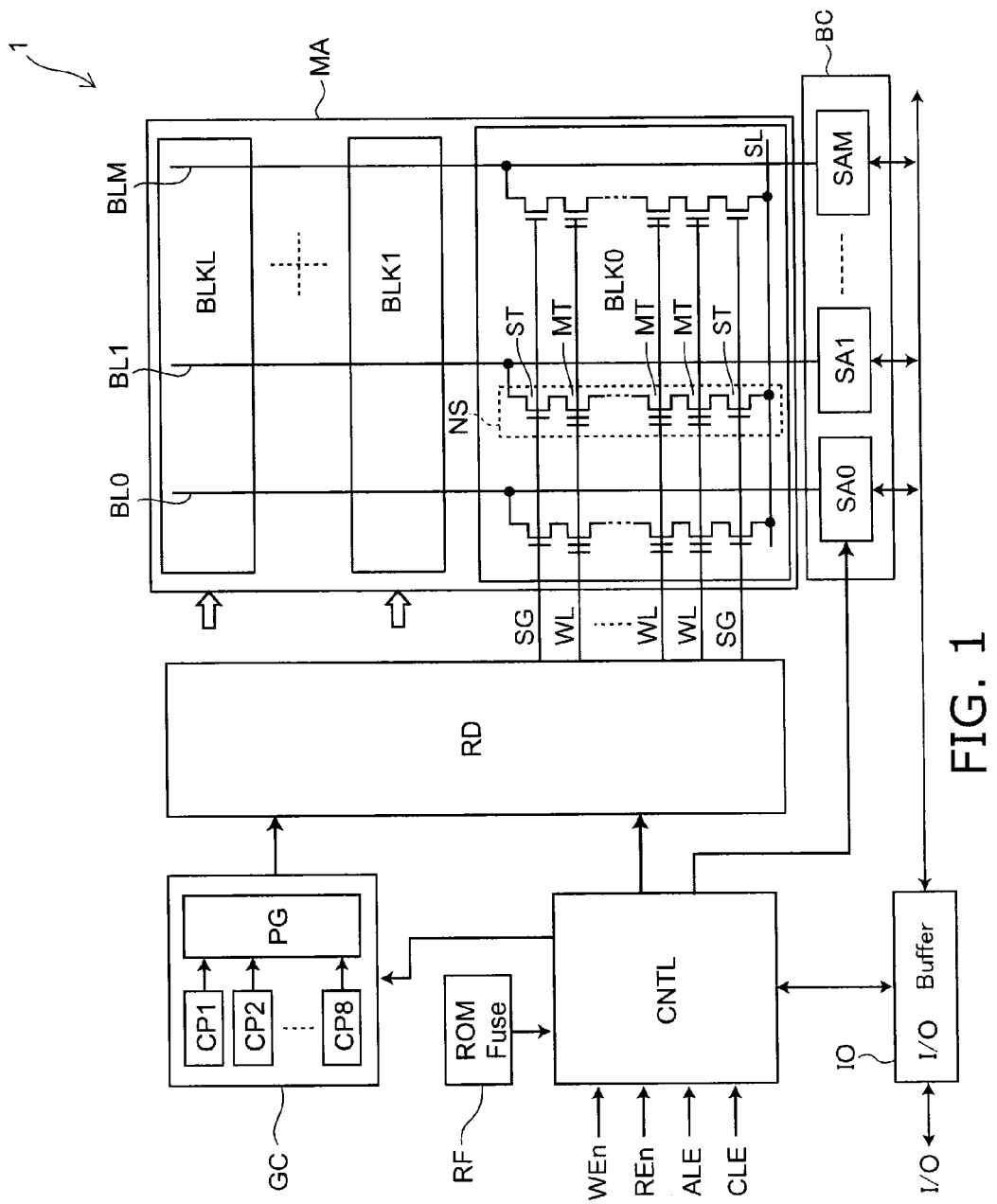
FIG. 1 is a circuit diagram showing a semiconductor memory device according to a first embodiment.

FIG. 1 is a circuit diagram showing a semiconductor memory device according to the embodiment.

Figure 2:
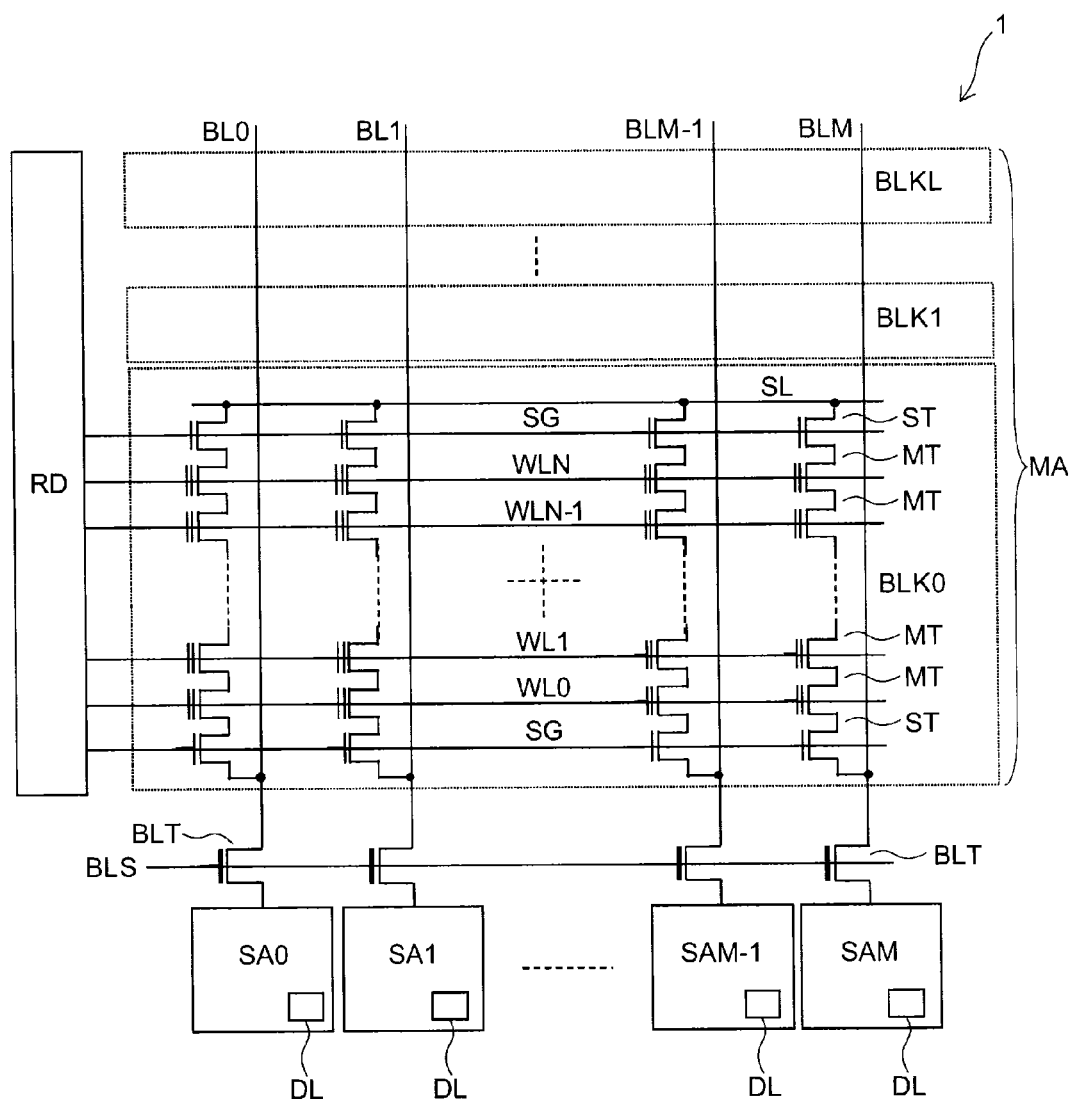
FIG. 2 is a circuit diagram showing a portion of the semiconductor memory device according to the first embodiment.

FIG. 2 is a circuit diagram showing a portion of the semiconductor memory device according to the embodiment.

Figure 3A:
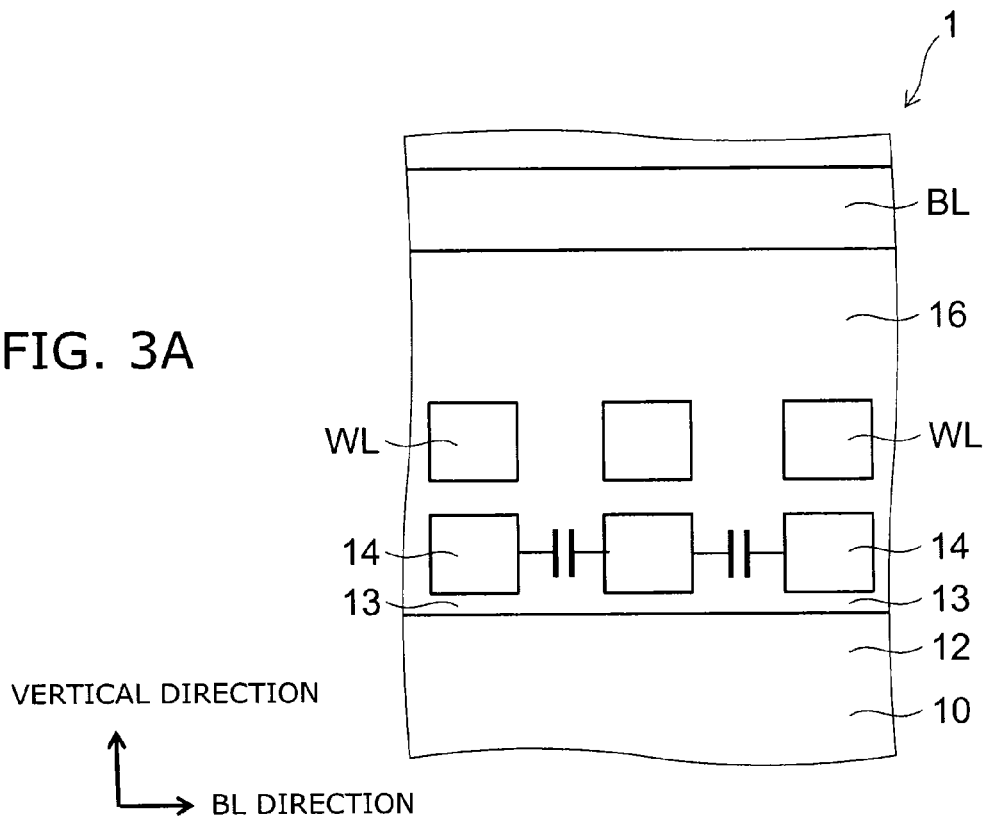
FIGS. 3A and 3B are cross-sectional views showing memory cell transistors of the semiconductor memory device according to the first embodiment.
Figure 3B:
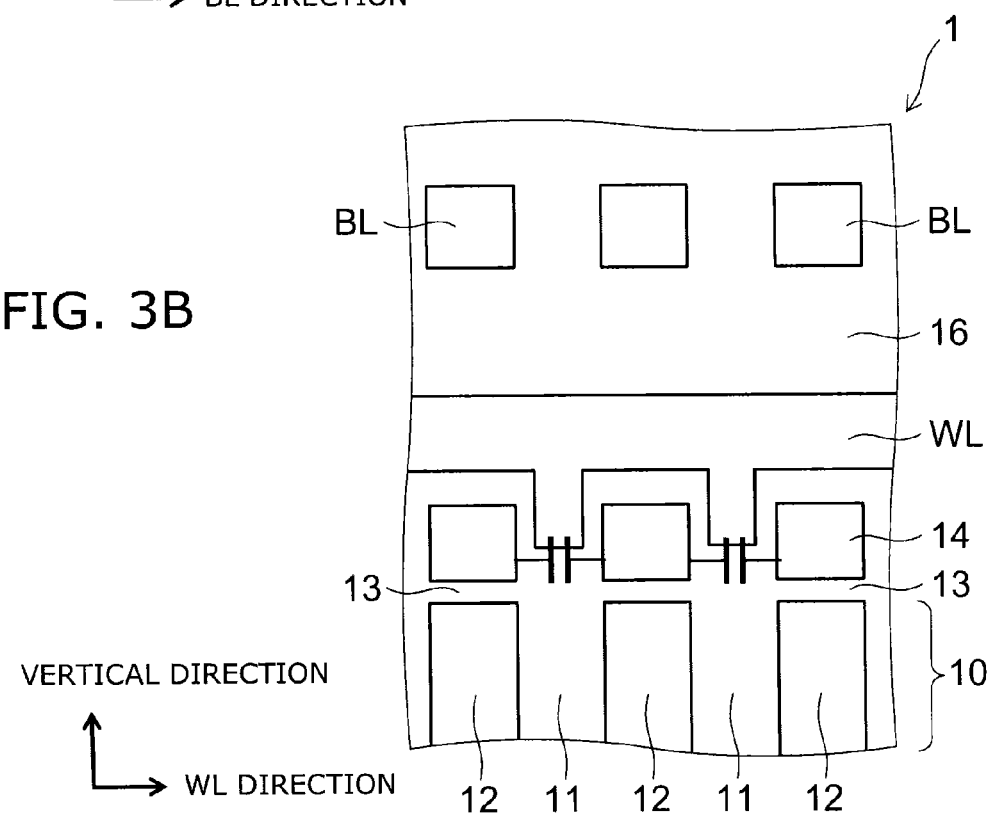

FIGS. 3A and 3B are cross-sectional views showing memory cell transistors of the semiconductor memory device according to the embodiment.

The semiconductor memory device according to the embodiment is NAND flash memory.

First, the configuration of the semiconductor memory device 1 will be described from the circuit aspect.

As shown in FIG. 1 and FIG. 2, the semiconductor memory device 1 according to the embodiment includes a memory cell array MA, a bit line control circuit BC, a row decoder RD, a control circuit CNTL, a power supply circuit GC, a ROM fuse RF, and an I/O buffer IO. The bit line control circuit BC, the row decoder RD, the power supply circuit GC, the ROM fuse RF, and the I/O buffer IO are connected to the control circuit CNTL. The power supply circuit GC also is connected to the row decoder RD.

Multiple blocks BLK0 to BLKL (hereinbelow, also generally referred to as the block BLK, where L is an integer not less than 0) are provided in the memory cell array MA. A control circuit (not shown) and multiple sense amplifiers SA0 to SAM (hereinbelow, also generally referred to as the sense amplifier SA, where M is an integer not less than 1) are provided in the bit line control circuit BC. A data latch DL is provided in each of the sense amplifiers SA. Each of the sense amplifiers SA is connected to the I/O buffer IO. Multiple charge pumps CP1 to CP8 and a charge pump control circuit PG are provided in the power supply circuit GC. The power supply circuit GC is a circuit that generates potentials such as the read-out potential, the programming potential, the erasing potential, etc., that are applied to word lines WL by a control of the control circuit CNTL. The defective block information, etc., are stored in the ROM fuse RF.

The semiconductor memory device 1 includes multiple bit lines BL0 to BLM (hereinbelow, also generally referred to as the bit line BL), multiple word lines WL0 to WLN (hereinbelow, also generally referred to as the word line WL, where N is an integer not less than 1), a source line SL, selection gate lines SG, and a bit line control line BLS. One selection transistor ST, N memory cell transistors MT, and one selection transistor ST are connected in this order in series between the bit line BL and the source line SL. The gate electrodes of the selection transistors ST are connected to the selection gate lines SG; and the control gate electrodes of the memory cell transistors MT are connected to the word lines WL.

The word lines WL and the selection gate lines SG are connected to the row decoder RD; and the bit lines BL are connected respectively to the sense amplifiers SA. Bit line control transistors BLT are connected between the sense amplifiers SA and the bit lines BL; and the gate electrodes of the bit line control transistors BLT are connected to the bit line control line BLS. The bit line control circuit BC is a circuit that reads the data stored in the memory cell transistors MT via the bit lines BL, senses whether or not the prescribed data is programmed to the memory cell transistors MT in a so-called verify operation, and programs the data to the memory cell transistors MT by applying the prescribed potential to the bit lines BL.

One NAND string NS includes N memory cell transistors MT and a pair of selection transistors ST connected in series; and one block BLK includes M NAND strings NS connected to one source line SL. A page is formed of the M memory cell transistors MT sharing one word line WL.

The data to be stored, the addresses that accompany the data, and various commands that control the operation of the semiconductor memory device 1 are input to the I/O buffer IO from outside the semiconductor memory device 1 when storing the data in the semiconductor memory device 1. Among the information that is input, the data is input to the bit line control circuit BC via the I/O buffer IO and input to the sense amplifiers SA of the bit line control circuit BC that are selected by the control circuit. On the other hand, the addresses and the commands are input to the control circuit CNTL. The control circuit CNTL controls the bit line control circuit BC, the row decoder RD, and the power supply circuit GC based on the addresses and the commands. As a result, the bit lines BL are selected by the bit line control circuit BC; and the potential generated by the power supply circuit GC is applied selectively to the word lines by the row decoder RD. Thereby, the data is programmed to the memory cell transistors MT.

On the other hand, when reading the data stored in the semiconductor memory device 1, the bit line control circuit BC, the row decoder RD, and the power supply circuit GC cooperate by the control of the control circuit CNTL to read the data stored in the memory cell transistors MT and store the data in the data latches DL of the sense amplifiers SA. Then, the data stored in the data latches DL is output outside the semiconductor memory device 1 via the I/O buffer IO.

The configuration of the memory cell array MA will now be described from the device aspect.

As shown in FIGS. 3A and 3B, a silicon substrate 10 is provided in the semiconductor memory device 1. Multiple STIs (shallow trench isolations) 11 are formed in the upper layer portion of the silicon substrate 10 to extend in one direction (hereinbelow, called "the BL direction"); and the portions of the upper layer portion of the silicon substrate 10 between the STIs 11 are active areas 12. Gate insulating films 13 are provided on the active areas 12; and charge storage layers 14 are provided on the gate insulating films 13. The charge storage layers 14 are arranged intermittently along the BL direction in the regions directly above the active areas 12. Accordingly, the charge storage layers 14 are arranged in a matrix configuration along both the BL direction and a direction (hereinbelow, called "the WL direction") orthogonal to the BL direction in the regions directly above the multiple active areas 12.

The word lines WL described above are disposed on the charge storage layers 14 to extend in the WL direction. The selection gate lines SG are disposed on two sides of a set made of N word lines WL to extend in the WL direction. A bit line contact (not shown) extending in a direction (hereinbelow, called the vertical direction) orthogonal to the BL direction and the WL direction is provided on one side of the group including the set made of the N word lines WL and the pair of selection gate lines SG disposed on the two sides of the set as viewed from the group; and the lower end of the bit line contact is connected to the active area 12. On the other hand, the source line SL extending in the WL direction is disposed on the other side as viewed from the group described above; and the lower end of the source line SL is connected to the active area 12. The bit line BL described above is disposed in the region directly above each of the active areas 12 above the word lines WL, the selection gate lines SG, and the source line SL. The bit line BL extends in the BL direction and is connected to the upper end of the bit line contact. An inter-layer insulating film 16 is provided on the silicon substrate 10 to cover the charge storage layers 14, the word lines WL, the selection gate lines SG, the source line SL, and the bit line BL.

Thereby, in each of the blocks, the memory cell transistor MT including one charge storage layer 14 is formed at each intersection between each of the active areas 12 and each of the word lines WL. Accordingly, the multiple memory cell transistors MT are arranged in a matrix configuration along the BL direction and the WL direction in the memory cell array MA of the semiconductor memory device 1. Also, the selection transistor ST is formed at each intersection between each of the active areas 12 and each of the selection gate lines SG. The memory cell transistors MT and the selection transistors ST are, for example, n-channel transistors.

Operations of the semiconductor memory device according to the embodiment will now be described.

First, a programming operation of data will be described.

Figure 4A:
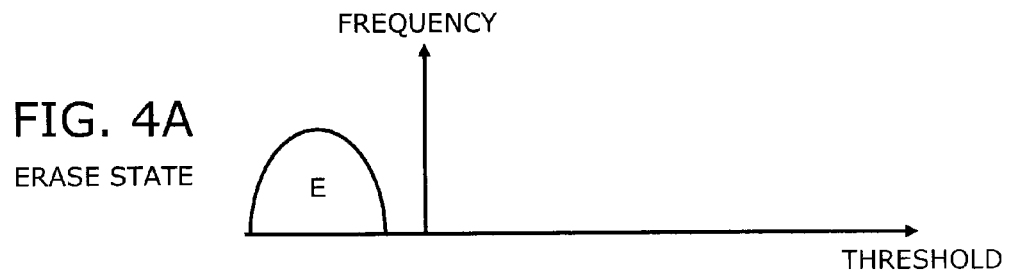
FIGS. 4A to 4C are graphs showing threshold distributions of the memory cell transistors.
Figure 4B:
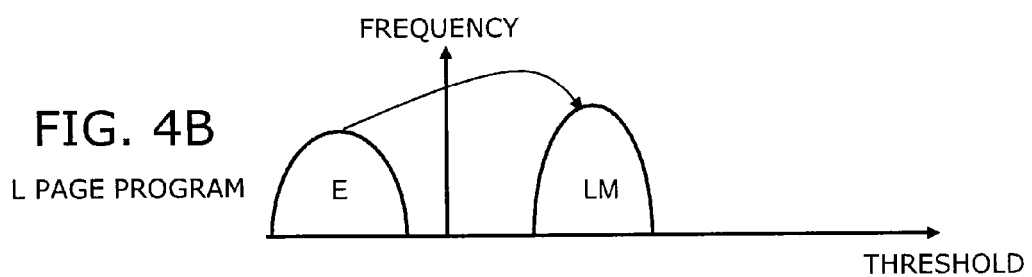
Figure 4C:
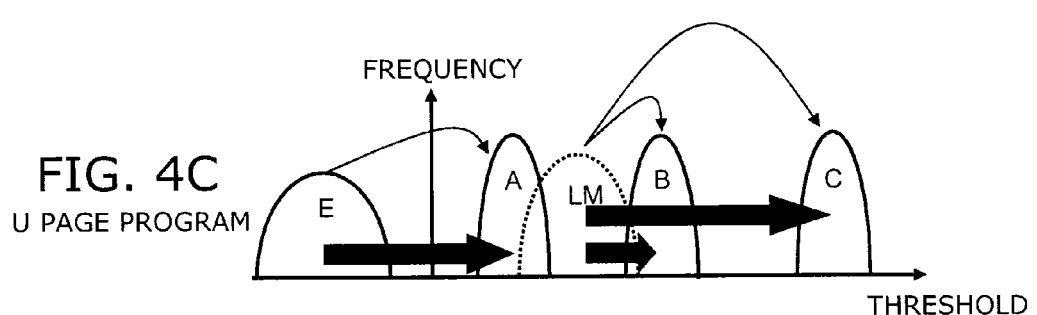

FIGS. 4A to 4C are graphs showing threshold distributions of the memory cell transistors, where the horizontal axis is the thresholds of the memory cell transistors, and the vertical axis is the frequency. FIG. 4A shows an erase state; FIG. 4B shows a state after an L page program; and FIG. 4C shows a state after a U page program.

Figure 5:
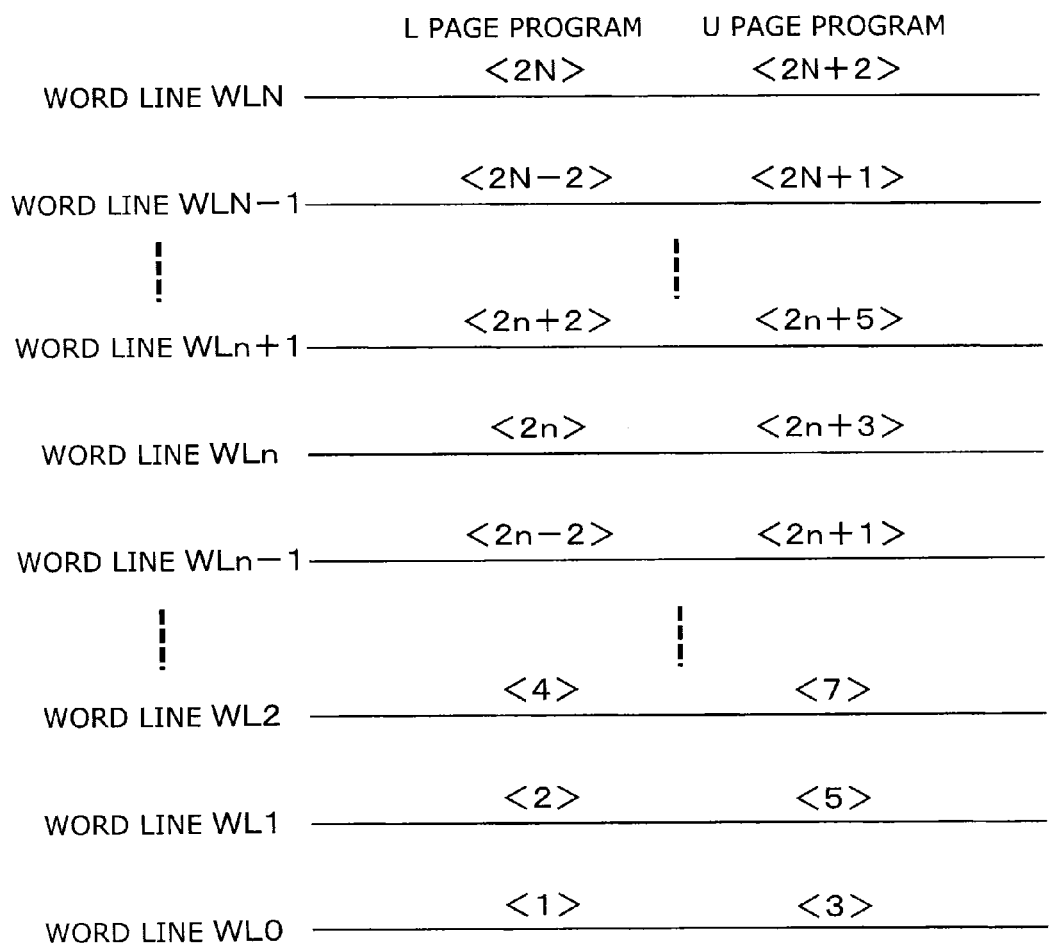
FIG. 5 is a graph showing the programming order of pages inside each of the blocks.

FIG. 5 is a graph showing the programming order of pages inside each of the blocks.

As shown in FIG. 1, FIG. 2, and FIGS. 3A and 3B, when programming the data to the memory cell transistors MT (hereinbelow, also referred to as simply the cells), the control circuit CNTL controls the bit line control circuit BC, the row decoder RD, and the power supply circuit GC to apply a positive programming potential to one of the word lines WL and apply a pass potential that causes the cells to be in the ON state to the other word lines WL. Then, according to the data input from the outside, for example, a ground potential GND is applied to the bit lines BL connected to the cells to which the values are to be programmed, i.e., the cells for which the threshold voltages are to be increased, to cause the potentials of the active areas 12 to be the ground potential. Thereby, electrons are injected into the charge storage layers 14 from the active areas 12; and the threshold distributions of the cells shift toward the positive side. On the other hand, for the cells to which values are not programmed, i.e., the cells for which the threshold voltages are not to be increased, the active areas 12 are caused to be in the floating state after applying a power supply potential VDD to the bit lines BL. Thereby, the potentials of the active areas 12 increase due to coupling with the word lines WL; and electrons are not injected into the charge storage layers 14 even for the cells for which the programming potential is applied to the word lines WL. This is similar for the cells for which the programming of the values has ended; and further programming is prohibited.

The case where quaternary data is programmed to an n-channel memory cell transistor MT will now be described.

In the embodiment as shown in FIGS. 4A to 4C, the programming of the data is divided into two stages. The values of the data are taken as "E", "A", "B" and "C" from the order of the lowest thresholds of the memory cell transistors MT. For example, the threshold of value "E" is negative; and the thresholds of values "A", "B", and "C" are positive.

As shown in FIG. 4A, all of the cells to be programmed with data are caused to be in the erase state in which the data is erased. The value is "E" in the erase state.

From this state, as shown in FIG. 4B, the electrons are injected into the charge storage layers 14 for a portion of the multiple memory cell transistors MT that share one word line WL, i.e., the multiple cells belonging to one page, by selectively applying a potential to the multiple bit lines BL. Thereby, the thresholds of the cells increase; and the threshold distribution shifts. The state after the threshold distribution has shifted is called medium value "LM" for convenience. In the specification, the first programming is called the L page program (Lower page program). After the L page program, the threshold distributions of the cells are divided into value "E" and medium value "LM".

Then, as shown in FIG. 4C, for a portion of the cells of value "E", the value is caused to be "A" by injecting a charge into the charge storage layers 14. Also, the charge is injected into a portion of the cells of medium value "LM" to cause the value to be "B". Further, the charge is injected into the remaining cells of medium value "LM" to cause the value to be "C". In the specification, the second programming is called the U page program (Upper page program). After the U page program, the threshold distributions are divided into the four levels of values "E", "A", "B" and "C". In the U page program, the injection amount of the charge when maintaining value "E" is zero; and the injection amount of the charge when changing the value from "LM" to "B" is relatively small. Conversely, the injection amount of the charge when changing the value from "E" to "A" and when changing the value from "LM" to "C" is relatively large.

Although such an L page program and such a U page program are performed, for example, for each page from the source line SL side toward the bit line BL side, there are few cases where the L page program and the U page program are executed continuously for the same page. This is because, as shown in FIG. 3A, adjacent cell coupling between cells that are adjacent to each other in the BL direction occurs due to capacitive coupling between the charge storage layers 14 that are adjacent to each other in the BL direction; and the threshold distributions of the cells that are previously programmed fluctuate due to effects of the programming operation of the adjacent cells that are subsequently executed. Specifically, when the charge is injected into the one cell, capacitive coupling causes the potential of the charge storage layer 14 of a cell adjacent to the one cell to decrease and the apparent threshold of the one cell to increase.

Accordingly, if value "E", "A", "B" or "C" is programmed to the cells belonging to one page by performing the L page program and the U page program to the one page and subsequently performing the L page program and the U page program to an adjacent page, the threshold distributions of the cells that were previously programmed fluctuate greatly by being undesirably affected by both the L page program and the U page program of the adjacent cells. The fluctuation amount of the threshold caused by such adjacent cell coupling is not uniform between the cells because the fluctuation amount depends on the data pattern of the surrounding cells, the threshold fluctuation amount of the adjacent cells, the coupling ratio with the surrounding cells, etc. Accordingly, the threshold distributions of the cells undesirably spread each time the cells are affected by the programming of the adjacent cells. In the case where the threshold distributions of the cells spread, the width of the potential between the threshold distributions becomes narrow. As a result, the determination of the values becomes difficult; and the reliability of the read-out operation undesirably decreases.

Therefore, in the embodiment as shown in FIG. 5, <1> the L page program of the word line WL0 is performed; subsequently, <2> the L page program of the word line WL1 is performed; and subsequently, <3> the U page program of the word line WL0 is performed. When generalized using n which is an integer from 2 to (N−1), <2n> the L page program of the word line WLn is performed; subsequently, <2n+1> the U page program of the word line WL(n−1) which is one previous is performed and <2n+2> the L page program of the word line WL(n+1) which is one subsequent is performed; and subsequently, <2n+3> the U page program of the word line WLn is performed. In other words, between the L page program and the U page program of one page, the U page program of the page one previous and the L page program of the page one subsequent are completed. In such a case, the effects on one page due to the adjacent cells after performing the U page program to adjust the threshold distributions having values "A", "B" and "C" are only from the U page program of the page one subsequent; and the fluctuation of the threshold distributions can be suppressed.

A read-out operation of the data will now be described.

Figure 6:
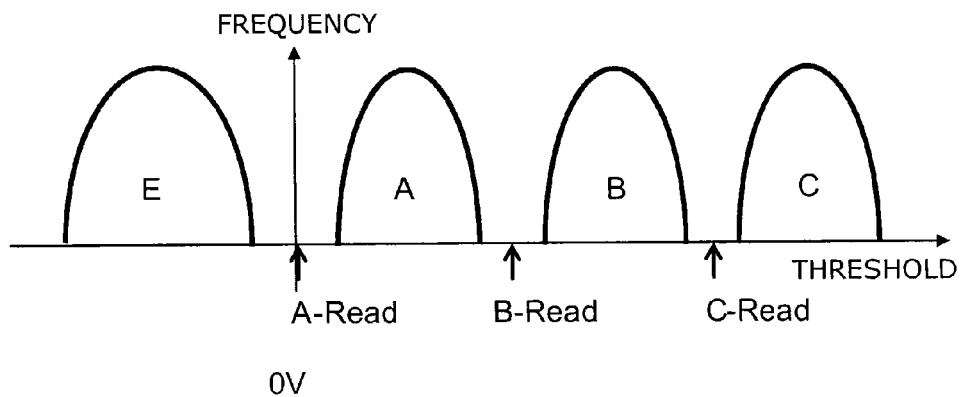
FIG. 6 is a graph showing the relationship between the threshold distributions and the values programmed to the memory cell transistors.

FIG. 6 is a graph showing the relationship between the threshold distributions and the values programmed to the memory cell transistors, where the horizontal axis is the thresholds of the memory cell transistors, and the vertical axis is the frequency.

Figure 7:
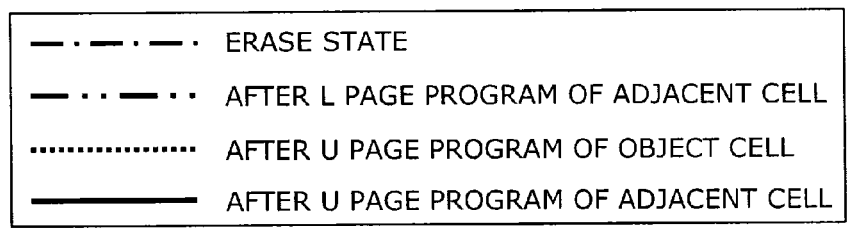
FIG. 7 is a graph showing the fluctuation of the threshold distributions of the memory cell transistors.
Figure 7:
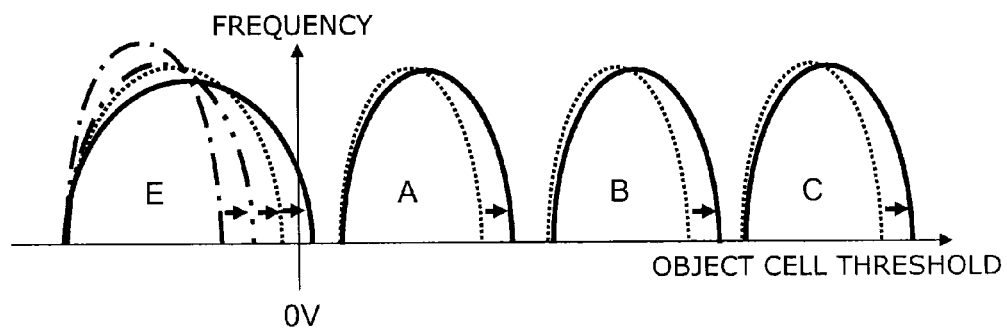

FIG. 7 is a graph showing the fluctuation of the threshold distributions of the memory cell transistors, where the horizontal axis is the thresholds of the memory cell transistors, and the vertical axis is the frequency.

Figure 8:
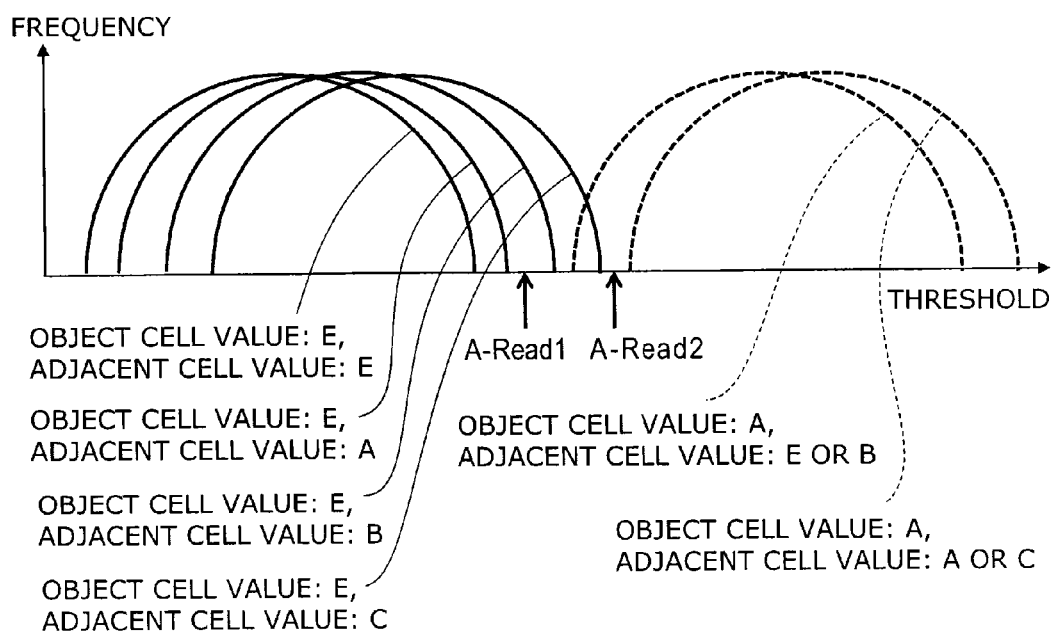
FIG. 8 is a graph showing the fluctuation of the threshold distributions of values "E" and "A"

FIG. 8 is a graph showing the fluctuation of the threshold distributions of values "E" and "A", where the horizontal axis is the thresholds of the memory cell transistors, and the vertical axis is the frequency.

Figure 9A:
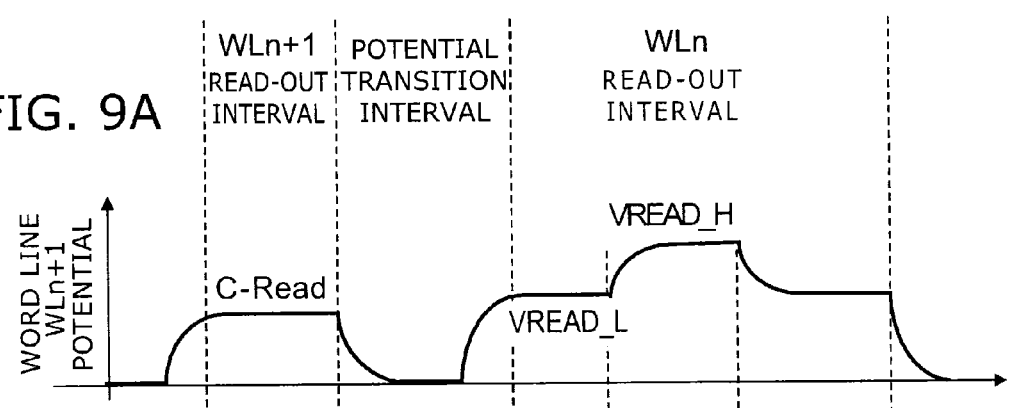
FIGS. 9A to 9C are timing charts showing the operation of the U page read of the first embodiment.
Figure 9B:
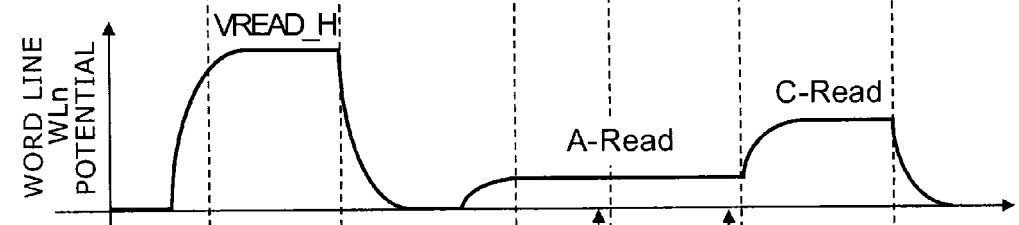
Figure 9C:
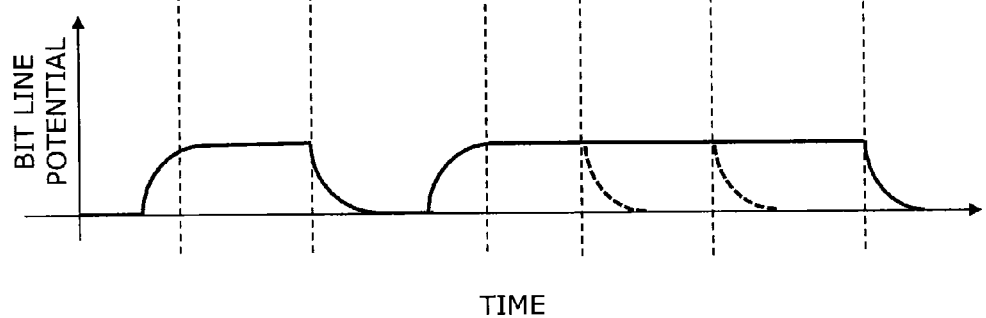

FIGS. 9A to 9C are timing charts showing the operation of the U page read of the embodiment, where the horizontal axis is the time, and the vertical axis is the potentials.

When reading the data programmed to one of the memory cell transistors MT, a prescribed read-out potential is applied to the control electrode of the memory cell transistor MT, i.e., the word line WL. As shown in FIG. 6, for example, in the case where value "E" and value "A" are discriminated, the read-out potential is a potential A-Read that is higher than the upper limit of the threshold distribution of the cells programmed with value "E" and lower than the lower limit of the threshold distribution of the cells programmed with value "A". A pass potential that is high enough that the memory cell transistors MT are always switched to the ON state is applied to the remaining word lines WL. In this state, the potentials are applied simultaneously to all of the bit lines BL by the sense amplifiers SA. As a result, the voltages are applied between the sources and the drains of the memory cell transistors MT; and the current flows from the sense amplifiers SA to the source line SL by way of the bit lines BL, the bit line contacts, and the active areas 12.

If value "E" is programmed to the cell to be the read in the case where the read-out potential is the potential A-Read, the magnitude of the current that flows is not less than the reference value because the cell is switched to the ON state. On the other hand, if value "A" is programmed to the cell, the magnitude of the current that flows is less than the reference value because the cell is switched to the OFF state. Accordingly, the value programmed to the memory cell transistor MT can be discriminated by a sense amplifier SA sensing the magnitude of the current flowing in the bit line BL.

Then, in the embodiment as shown in FIG. 6, the data that is originally quaternary is read by being divided into the binary L page data and the binary U page data.

In the L page read, the read-out potential is set to be a potential B-Read which is between the threshold distribution of value "A" and the threshold distribution of value "B", and it is sensed whether or not a current of the reference value or more flows in the memory cell transistor MT to be read (hereinbelow, also referred to as the object cell). Then, if the current of the reference value or more flows, the object cell is determined to be in the ON state; and the L page data is caused to be value "1". On the other hand, if a current of the reference value or more does not flow, the object cell is determined to be in the OFF state; and the L page data is caused to be value "0". Thus, it is determined whether the value of the object cell is in a first group (L page data: 1) made of value "E" having the lowest threshold distribution and value "A" having the second lowest threshold distribution or in a second group (L page data: 0) made of value "B" having the third lowest threshold distribution and value "C" having the highest threshold distribution.

In the U page read, the read-out potential is set to be the potential A-Read which is between the threshold distribution of value "E" and the threshold distribution of value "A", and it is sensed whether or not a current of the reference value or more flows in the object cell. Thereby, it is determined whether the value of the object cell is "E" or the value of the object cell is "A", "B" or "C". Then, the read-out potential is set to be a potential C-Read which is between the threshold distribution of value "B" and the threshold distribution of value "C", and it is sensed whether or not a current of the reference value or more flows in the object cell. Thereby, it is determined whether the value of the object cell is "E", "A" or "B" or the value of the object cell is "C". Then, the U page data is caused to be value "1" in the case where a current of the reference value or more flows when the read-out potential is the potential A-Read, that is, in the case where the value of the object cell is "E", and in the case where a current of the reference value or more does not flow when the read-out potential is the potential C-Read, that is, in the case where the value of the object cell is "C", and the U page data is caused to be value "0" in the case where a current of the reference value or more does not flow when the read-out potential is the potential A-Read and a current of the reference value or more flows when the read-out potential is the potential C-Read, that is, in the case where the value of the object cell is "A" or "B".

As described above, in the embodiment, the fluctuation of the threshold distribution of the object cell due to the programming operation of the adjacent cell is suppressed by implementing the sequence shown in FIG. 5 in the programming operation. However, even by the method shown in FIG. 5, a certain amount of fluctuation of the threshold distribution occurs unavoidably due to the U page program of the cell that is one subsequent. In the case where the threshold distribution fluctuates, there is a possibility that read-out errors may occur when the data is read at uniform reading conditions. For example, when the threshold distribution of value "E" fluctuates greatly in the positive direction and the upper tail of the threshold distribution exceeds the potential A-Read, a portion of the cells which are originally value "E" is undesirably determined to be value "A". Therefore, in the embodiment, in the case where the fluctuation amount of the threshold distribution is particularly large, the read-out precision of the data is increased by modifying the reading condition.

Cases where the fluctuation amount of the threshold distribution becomes particularly large will now be described.

As illustrated by the broken line in FIG. 7, the threshold distribution of the object cell (e.g., a cell of the page of the word line WLn) is set in the U page program of the object cell in the case where value "A", "B" or "C" is programmed. However, as illustrated by the solid lines in FIG. 7, the threshold distribution of the object cell fluctuates such that the width of the threshold distribution spreads in the direction of higher threshold voltages due to effects of the U page program of the adjacent cell (the cell of the page of word line WL(n+1), also referred to as the adjacent cell hereinbelow) that belongs to the same NAND string as the object cell.

On the other hand, although the threshold distribution in the erase state is used without actively causing the threshold distribution to fluctuate in the case where the value of the object cell is caused to be "E", actually, the threshold distribution fluctuates due to effects of the programming of the surrounding memory cells. In other words, the threshold distribution in the erase state is the distribution illustrated by the single dot-dash line in FIG. 7. The threshold distribution fluctuates due to the effects of the L page program of the cell of the page one previous (the cell of the page of the word line WL(n−1)), the L page program of the object cell, and the U page program of the cell of the page one previous; and subsequently, the threshold distribution fluctuates in the positive direction as illustrated by the double dot-dash line in FIG. 7 due to the L page program of the adjacent cell (the cell of the page of the word line WL(n+1)). Then, in the U page program of the object cell, the threshold distributions fluctuate as illustrated by the broken lines in FIG. 7 due to the adjacent cell coupling of the memory cells that are adjacent in the word line direction. Subsequently, the threshold distributions fluctuate as illustrated by the solid lines in FIG. 7 due to the U page program of the adjacent cells.

Thus, the effect of the adjacent cell on the threshold distribution of the object cell differs according to the value of the object cell. Specifically, although the programming of the adjacent cell that affects the value of the object cell in the case where the value of the object cell is "A", "B" or "C" is only the U page program, the value of the object cell is affected by both the L page program and the U page program of the adjacent cell in the case where the value of the object cell is "E". Therefore, the fluctuation amount is larger for the threshold distribution of value "E" than for the threshold distribution of value "A", "B" or "C".

Also, the effect of the adjacent cell on the threshold distribution of the object cell differs according to the value of the adjacent cell.

As shown in FIG. 8, in the case where the value of the object cell is "E", the fluctuation amount of the threshold distribution differs according to the value of the adjacent cell being "E", "A", "B" or "C" and the threshold distribution is shifted in the positive direction due to an effect (adjacent cell coupling) that increases as the threshold of the adjacent cell increases. In other words, the fluctuation of the threshold distribution of value "E" of the object cell is largest when the value of the adjacent cell is "C".

On the other hand, in the case where the value of the object cell is "A", "B" or "C" the fluctuation amount of the threshold distribution is relatively small in the case where the value of the adjacent cell is "E" or "B" and is relatively large in the case where the value of the adjacent cell is "A" or "C". As described above, this is due to the following reasons. Namely, in the U page program of the adjacent cell, the injection amount of the charge when maintaining value "E" is substantially zero; and the injection amount of the charge when changing the value from "LM" to "B" is relatively small. On the other hand, the injection amount of the charge is relatively large when changing the value from "E" to "A" and when changing the value from "LM" to "C".

From the description recited above, the combination in which the fluctuation of the threshold distribution is particularly large and greatly affects the precision of the read-out operation is the case where the value of the object cell is "E" and the value of the adjacent cell is "C". Because the threshold distribution of value "E" is shifted greatly in the positive direction in such a case, the possibility of read-out errors occurring is high when a potential A-Read1 that is suited in the case where the value of the adjacent cell is "E" is applied as the read-out potential of the object cell. Accordingly, in such a case, it is favorable for the reading condition to be modified to a condition corresponding to the case where the read-out potential is a potential A-Read2. The potential A-Read2 is a read-out potential suited to the case where the value of the adjacent cell is "C".

The operation of the U page read will now be described in detail with reference to timing charts.

In the U page read as shown in FIGS. 9A to 9C, first, it is sensed whether or not the value of the adjacent cell is value "C" as a preliminary read-out. Subsequently, as the main read-out, the discrimination of whether or not the value of the object cell is "E" is performed using conditions having two levels. As described below, in the embodiment, the conditions having two levels are realized by changing the potential of the word line WL(n+1) to two levels. Then, the results read at one selected from the conditions is employed as the value of the object cell according to the value of the adjacent cell. Continuing, the discrimination of whether or not the value of the object cell is "C" is performed using a condition having one level.

Specifically, first, the value of the adjacent cell is determined in a WL(n+1) read-out interval. Namely, a pass potential VREAD_H is applied to the word line WLn; the read-out potential C-Read is applied as a preliminary read-out potential to the word line WL(n+1); and a prescribed positive potential is applied to the bit lines BL. In this state, the sense amplifiers SA sense the current flowing in the bit lines BL. Then, the latched values of the adjacent cells having the word line WL(n+1) as the control gate electrodes are stored in the data latches DL of the sense amplifiers SA as "0" if a current of the reference value or more flows; and the latched values of the adjacent cells having the word line WL(n+1) as the control gate electrodes are stored as "1" in the data latches DL of the sense amplifiers SA if a current of the reference value or more does not flow. In such a case, the latched value "0" indicates that the value of the adjacent cell is "E", "A" or "B", and the latched value "1" indicates that the value of the adjacent cell is "C".

Then, in a potential transition interval, the potentials of the word lines WL and the bit lines BL are stepped-down to 0 V. Subsequently, the read-out potential A-Read is applied to the word line WLn; the pass potential VREAD_L is applied to the word line WL(n+1); and the prescribed positive potential is applied to the bit lines BL.

In the WLn read-out interval, the values of the object cells are read using the first condition. Namely, the sense amplifiers SA sense the current flowing in the bit lines BL at time t11 in a state in which the potentials of the interconnects have stabilized at the potentials described above. Then, for the object cells for which the latched values of the adjacent cells are "0", the value of the U page data is caused to be "1" for the object cells for which a current of the reference value or more flows and "0" for the object cells for which a current of the reference value or more does not flow. When converted to the four values, these correspond respectively to value "E" and value "A".

Then, the values of the object cells are read using the second condition. Namely, the potential of the word line WL(n+1) is stepped-up to the pass potential VREAD_H while maintaining the potentials of the word line WLn and the bit lines BL. When the potential of the word line WL(n+1) is the pass potential VREAD_H, the effective potential of the word line WLn is higher than that of the case of a pass potential VREAD_L because the coupling effect occurs between the mutually-adjacent word lines WL. Thereby, an effect is obtained that corresponds to the case where the potential of the word line WLn is stepped-up from the potential A-Read1 to the potential A-Read2 shown in FIG. 8. In this state, the sense amplifiers SA sense the current flowing in the bit lines BL at time t12. Then, for the object cells for which the latched values of the adjacent cells are "1", the value of the U page data is caused to be "1" for the object cells for which a current of the reference value or more flows and "0" for the object cells for which a current of the reference value or more does not flow. When converted to the four values, these correspond respectively to the value "E" and value "A".

Then, the potential of the word line WLn is stepped-up to the read-out potential C-Read and the potential of the word line WL(n+1) is stepped-down to the pass potential VREAD_L while maintaining the potential of the bit lines BL. In this state, the sense amplifiers SA sense the current flowing in the bit lines BL. Then, the value of the U page data is caused to be "0" for the object cells for which a current of the reference value or more flows and "1" for the object cells for which a current of the reference value or more does not flow. When converted to the four values, these correspond respectively to value "B" and value "C". Subsequently, the potentials of the word lines WL and the bit lines BL are stepped-down to 0 V.

Effects of the embodiment will now be described.

In the embodiment as described above, the L page program of the adjacent cell is performed prior to performing the U page program of the object cell in the programming operation shown in FIG. 5. Therefore, the fluctuation of the threshold distribution can be suppressed in the case where the value of the object cell is "A", "B" or "C". As shown in FIGS. 9A to 9C, when discriminating whether the value of the object cell is "E" or is "A", "B" or "C", the discrimination result at the first condition, that is, when the potential of the word line WL(n+1) is set to be the pass potential VREAD_L, is employed in the case where the value of the adjacent cell is other than "C", and the discrimination result at the second condition, that is, when the potential of the word line WL(n+1) is set to be the pass potential VREAD_H, is employed in the case where the value of the adjacent cell is "C". By setting the potential of the word line WL(n+1) to be the pass potential VREAD_H which is higher than the pass potential VREAD_L, the effective read-out potential of the word line WLn increases due to the coupling effect; and the discrimination reference of the threshold shifts toward the positive side. Thereby, the value of the object cell can be read accurately even in the case where the value of the object cell is "E", the value of the adjacent cell is "C", and the threshold distribution is greatly shifted toward the positive side. Also, in the embodiment, the time necessary for the read-out operation does not increase drastically because the countermeasures described above are taken only in the case where the shift amount of the threshold distribution becomes large.

In the embodiment, the potential of the bit lines BL may be reduced to 0 V for the object cells for which the values have been determined as illustrated by the broken lines in FIG. 9C. Such an operation is called lockout. Thereby, the current consumption of the read-out operation can be reduced.

A first comparative example of the first embodiment will now be described.

Figures 10A, 10B, 10C:
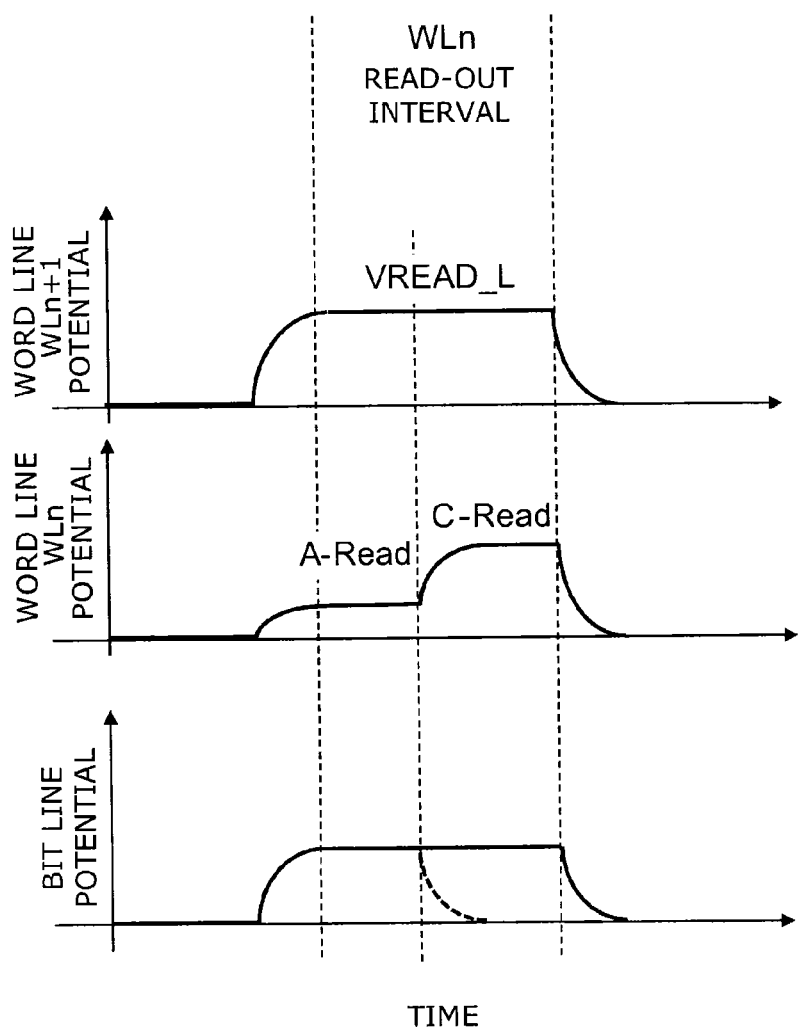
FIGS. 10A to 10C are timing charts showing the operation of a U page read according to a first comparative example.

FIGS. 10A to 10C are timing charts showing the operation of a U page read according to the comparative example, where the horizontal axis is the time, and the vertical axis is the potentials.

In the U page read in the comparative example as shown in FIGS. 10A to 10C, the discrimination of whether or not the value of the object cell is "E" is performed at a condition having one level without determining the value of the adjacent cell. In other words, the potential of the word line WL(n+1) is fixed at the pass potential VREAD_L in the WLn read-out interval. Therefore, in the case where the value of the object cell is "E" and the value of the adjacent cell is "C", the shift amount of the threshold distribution increases; and the possibility of read-out errors occurring increases.

A second comparative example of the first embodiment will now be described.

Figure 11A:
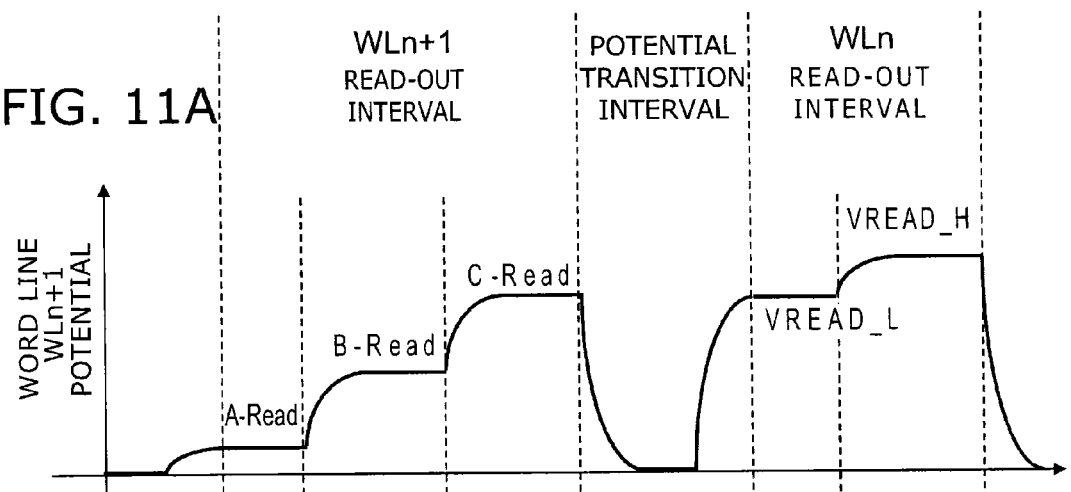
FIGS. 11A to 11C are timing charts showing the operation of an L page read of a second comparative example.
Figure 11B:
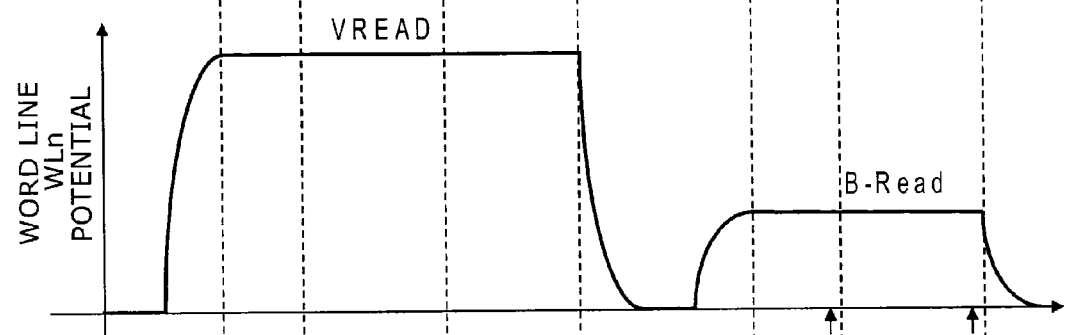
Figure 11C:
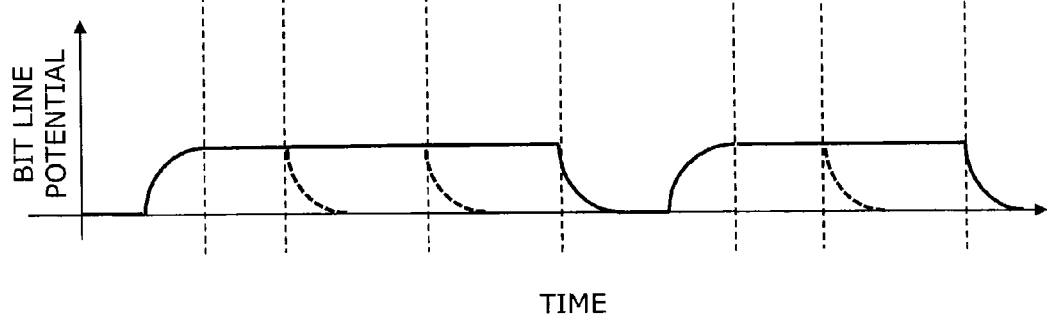

FIGS. 11A to 11C are timing charts showing the operation of an L page read of the comparative example, where the horizontal axis is the time, and the vertical axis is the potentials.

Figure 12A:
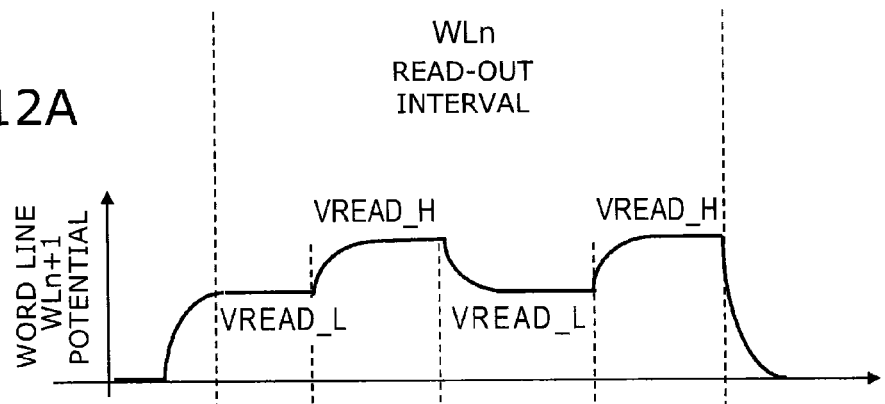
FIGS. 12A to 12C are timing charts showing the operation of a U page read of the second comparative example.
Figure 12B:
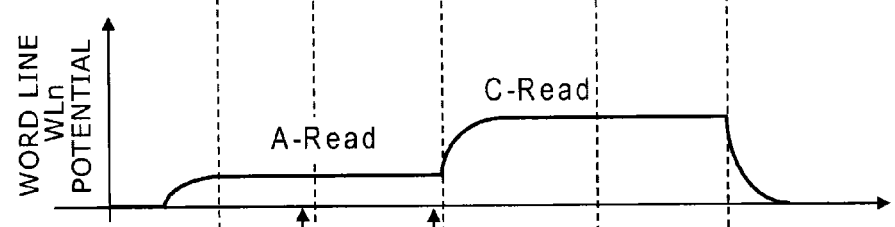
Figure 12C:
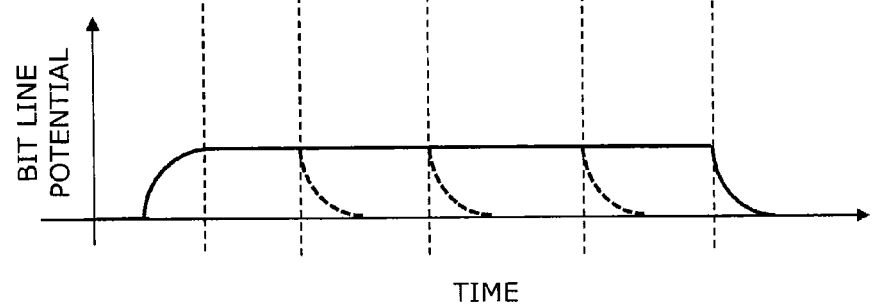

FIGS. 12A to 12C are timing charts showing the operation of a U page read of the comparative example, where the horizontal axis is the time, and the vertical axis is the potentials.

In the L page read of the comparative example as shown in FIGS. 11A to 11C, the WL(n+1) read-out interval is provided; and the values of the adjacent cells are read by the current flowing in the bit lines BL being sensed by the sense amplifiers SA while sequentially changing the potential of the word line WL(n+1) to be the potential A-Read, the potential B-Read, and the potential C-Read. Thereby, it can be determined whether or not the value of the adjacent cell is one value selected from "E", "A", "B" and "C". If the value of the adjacent cell is "E" or "B", the data latch is caused to maintain the latched value "0", and if the value of the adjacent cell is "A" or "C", the data latch is caused to maintain the latched value "1". Then, in the subsequent WLn read-out interval, reading conditions having two levels are set by changing the potential of the word line WL(n+1) to two levels after setting the potential of the word line WLn to be the read-out potential B-Read; and the L page read is performed. Thereby, the condition of the L page read can be selected based on the value of the adjacent cell.

As shown in FIGS. 12A to 12C, in the U page read as well, reading conditions having two levels are set by changing the potential of the word line WL(n+1) to two levels for both the discrimination of being value "E" or being value "A", "B" or "C" and the discrimination of being value "E", "A" or "B" or being value "C". Then, the reading condition is selected based on the value of the adjacent cell.

According to the comparative example, the data can be read with high precision because the reading condition can be selected by considering the adjacent cell coupling for all of the combinations of the values of the object cells and the values of the adjacent cells. However, the potential of the word line WL(n+1) is changed to three levels when reading the value of the adjacent cell. Moreover, the reading conditions having two levels are realized for all three levels of the read-out potential B-Read, A-Read, and C-Read when reading the values of the object cells. Therefore, the time necessary for the entire read-out operation undesirably becomes exceedingly long.

Conversely, according to the first embodiment, the reading condition is modified only in the case where the fluctuation amount of the threshold distribution becomes the largest, that is, in the case where the value of the adjacent cell is "C" and it is discriminated whether or not the value of the object cell is "E". Specifically, the preliminary read-out potential of the word line WL(n+1) is set at one level when reading the value of the adjacent cell; and the reading conditions having two levels are realized only for the read-out potential A-Read when reading the value of the object cell. Therefore, the precision of the read-out operation can be increased efficiently without greatly increasing the time necessary for the read-out operation.

A second embodiment will now be described.

Figure 13A:
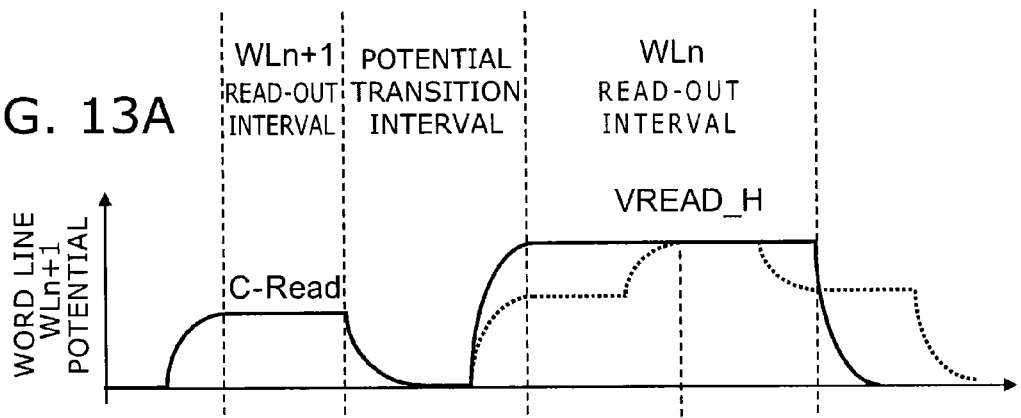
FIGS. 13A to 13C are timing charts showing the operation of a U page read of a second embodiment.
Figure 13B:
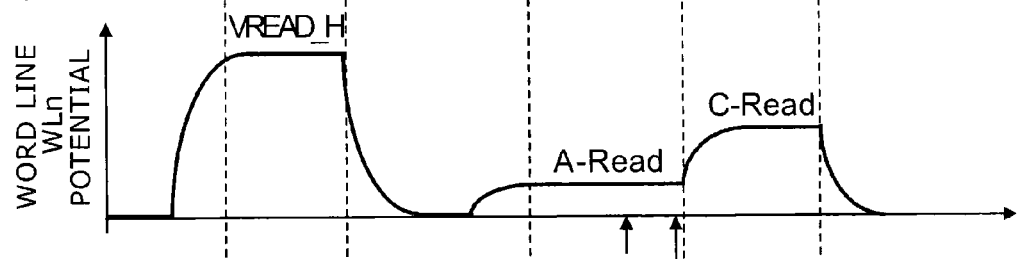
Figure 13C:
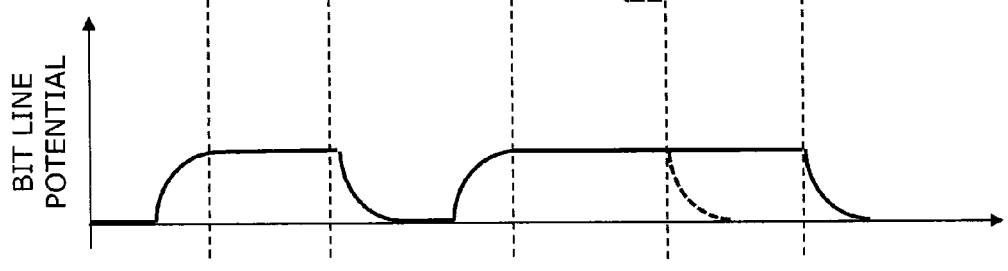

FIGS. 13A to 13C are timing charts showing the operation of a U page read of the embodiment, where the horizontal axis is the time, and the vertical axis is the potentials.

Figure 14:
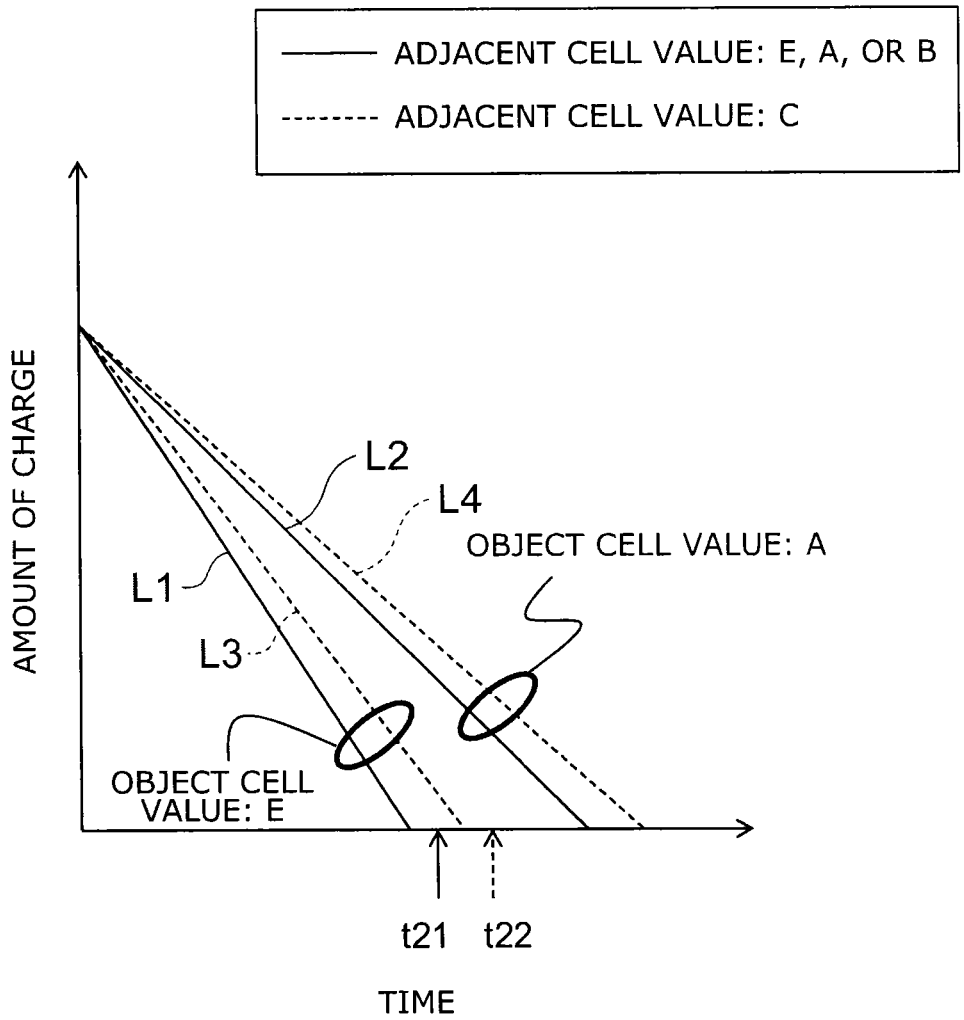
FIG. 14 is a graph showing the operation of the U page read of the second embodiment.

FIG. 14 is a graph showing the operation of the U page read of the embodiment, where the horizontal axis is the time, and the vertical axis is, for example, the amount of charge stored in the sense node of the sense amplifier.

For comparison in FIG. 13A, the potential change (referring to FIG. 9A) of the word line WL(n+1) of the first embodiment is illustrated by the broken line.

As shown in FIGS. 13A to 13C, compared to the first embodiment (referring to FIGS. 9A to 9C) described above, the semiconductor memory device according to the embodiment realizes the conditions having two levels used in the discrimination of value "E" in the U page read by shifting the timing of sensing the current flowing through the bit lines BL instead of changing the potential of the word line WL(n+1).

Specifically, in the WLn read-out interval, a constant amount of charge is stored in the sense amplifiers SA in a state in which the potential of the word line WLn is set to be the read-out potential A-Read and the potentials of the word lines WL other than the word line WLn are fixed to be a pass potential VREAD_H; and the constant amount of charge (hereinbelow, called the constant charge) is caused to flow in the object cells via the bit lines BL. Then, it is determined whether or not the constant charge has been discharged via the object cells by sensing a first current at time t21 after the passage of a first time period from when the current started to flow in the object cells. Then, it is determined whether or not the constant charge has been discharged via the object cells by sensing a second current at time t22 after the passage of a second time period from when the current started to flow in the object cells. Time t22 is a time after time t21; and the second time period from when the potential of the word line WLn is set to be the read-out potential A-Read to time t22 is longer than the first time period from when the potential of the word line WLn is set to be the read-out potential A-Read to time t21. Then, the sensing result at time t21 is employed in the case where the latched value stored in the data latch DL is "0", that is, in the case where the value of the adjacent cell is "E", "A" or "B" and the sensing result at time t22 is employed in the case where the latched value is "1", that is, in the case where the value of the adjacent cell is "C".

As shown in FIG. 14, if the value of the object cell is "E" when causing the constant charge described above to flow in the object cell while applying the prescribed read-out potential to the word line WL, the object cell is switched to the ON state. Therefore, a relatively large current is caused to flow; and the constant charge is consumed in a relatively short period of time. The solid line L1 of FIG. 14 illustrates the case where the value of the adjacent cell is "E", "A" or "B" and the value of the object cell is "E". On the other hand, if the value of the object cell is "A", the object cell is switched to the OFF state. Therefore, a relatively small current is caused to flow; and the constant charge is consumed in a relatively long period of time. The solid line L2 illustrates the case where the value of the adjacent cell is "E", "A" or "B" and the value of the object cell is "A". Accordingly, the flow/non-flow of the current is sensed at time t21; and the value of the object cell can be determined to be "A" if the current is flowing and "E" if the current is not flowing.

On the other hand, in the case where the value of the adjacent cell is "C", the threshold distribution of the object cell shifts toward the positive side; and the current no longer flows easily. Therefore, a longer period of time becomes necessary to consume the constant charge. Accordingly, the current change shifts from the solid line L1 to the broken line L3 in the case where the value of the object cell is "E" and the current change shifts from the solid line L2 to the broken line L4 in the case where the value of the object cell is "A". In such a case, the value of the object cell can be determined accurately by sensing the flow/non-flow of the current at time t22.

According to the embodiment, as shown in FIG. 13A, because the potential of the word line WL(n+1) is fixed at the pass potential VREAD_H, the time necessary for the discrimination of value "E" in the U page read can be shorter than that of the operation of the first embodiment described above illustrated by the broken line in FIG. 13A. Thereby, the time of the read-out operation can be shortened. Otherwise, the configuration, the operations, and the effects of the embodiment are similar to those of the first embodiment described above.

A third embodiment will now be described.

Figure 15A:
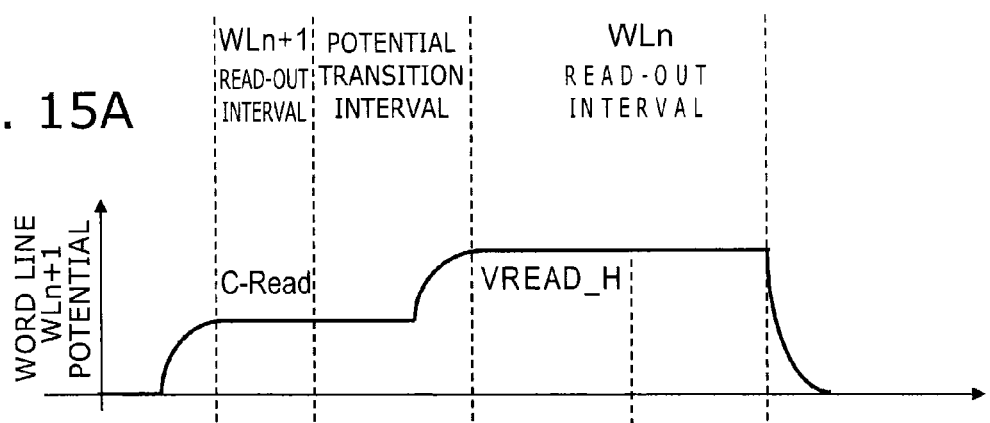
FIGS. 15A to 15C are timing charts showing the operation of a U page read of a third embodiment.
Figure 15B:
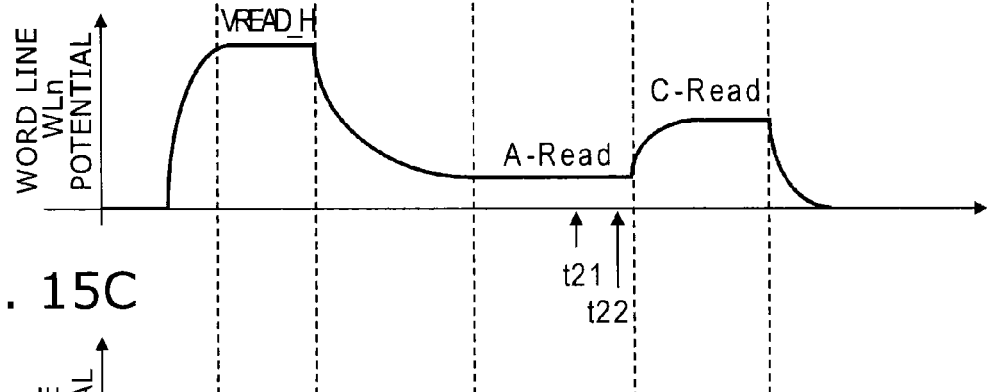
Figure 15C:
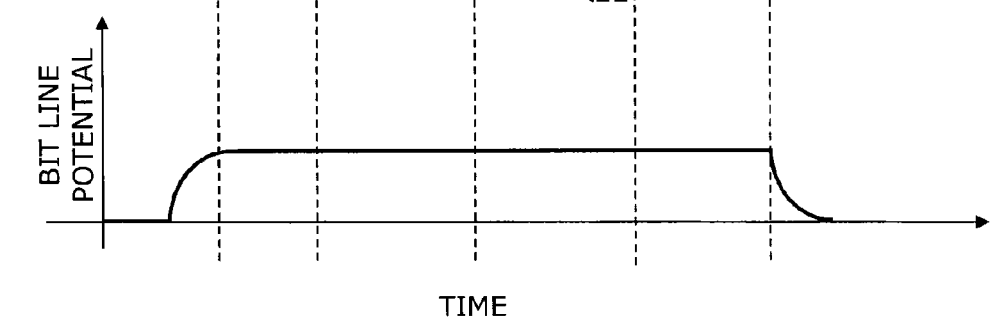

FIGS. 15A to 15C are timing charts showing the operation of a U page read of the embodiment, where the horizontal axis is the time, and the vertical axis is the potentials.

As shown in FIGS. 15A to 15C, the embodiment differs from the second embodiment described above in that the potentials of the word lines WL and the bit lines BL are caused to transition between the WL(n+1) read-out interval and the WLn read-out interval of the U page read without dropping to the ground potential GND (0 V). For example, the potentials of the word lines WL and the bit lines BL are changed by monotonously increasing or monotonously decreasing or are constant potentials between the WL(n+1) read-out interval and the WLn read-out interval. "Monotonously increasing" and "monotonously decreasing" include intervals of being maintained at the constant potential. The specification described above is a specification of the target value of the potential; and there are cases where the measured value of the potential includes micro fluctuation of the potential caused by the precision limit of the device and fluctuation of the potential for a short period of time caused by noise.

More specifically, as shown in FIG. 15A, the potential of the word line WL(n+1) is set to be the read-out potential C-Read in the WL(n+1) read-out interval; subsequently, the potential C-Read is maintained without being returned to the ground potential GND even when entering the potential transition interval; and subsequently, the potential is stepped-up to the pass potential VREAD_H in the WLn read-out interval.

As shown in FIG. 15B, the potential of the word line WLn is set to be the pass potential VREAD_H in the WL(n+1) read-out interval and is subsequently stepped-down to the read-out potential A-Read in the potential transition interval; and the read-out potential A-Read is maintained in the first half of the WLn read-out interval. Subsequently, the potential is stepped-up to the read-out potential C-Read in the latter half of the WLn read-out interval. The potentials of the word lines WL other than the word lines WLn and WL(n+1) are set to be a pass potential VREAD_D during the WL(n+1) read-out interval, the potential transition interval, and the WLn read-out interval. The pass potential VREAD_D is a potential lower than the pass potential VREAD_H.

As shown in FIG. 15C, the lockout operation of the bit lines BL, i.e., the operation of returning the potential of the bit lines connected to the cells for which the values are ascertained to the ground potential GND, can be stopped; and the potential of the bit lines BL may be a constant positive potential during the WL(n+1) read-out interval and the potential transition interval.

According to the embodiment, the potentials of the word lines WL and the bit lines BL are not returned to the ground potential GND between the WL(n+1) read-out interval and the WLn read-out interval of the U page read, e.g., are caused to transition between the potential that is necessary in the WL(n+1) read-out interval and the potential that is necessary in the WLn read-out interval by monotonously increasing, monotonously decreasing, or by maintaining a constant potential. Also, the lockout operation of the bit lines BL can be stopped in the WL(n+1) read-out interval and the potential transition interval. As a result, the read-out operation can be performed at high speed.

The potentials of the word lines WL other than the word lines WL(n+1) and WLn can be maintained at a constant potential in the WL(n+1) read-out interval and the potential transition interval. The potentials of the selection gate lines SG also can be maintained at a constant potential (without being reduced to 0 V) in the WL(n+1) read-out interval and the potential transition interval. Restated, the bit lines, the word lines WL other than the word lines WL(n+1) and WLn, and the potentials of the selection gate lines SG can be maintained at constant potentials in the WL(n+1) read-out interval and the potential transition interval. As a result, the read-out operation can be simplified; and the potentials of the word lines WL(n+1) and WLn can be stabilized. By maintaining the potentials of the selection gate lines SG at constant potentials, the selection transistors ST can be switched to the ON state during the interval from the WL(n+1) read-out interval to the WLn read-out interval. As a result, the memory cells connected to the word line WL(n+1) and the memory cells connected to the word line WLn can be read continuously. Thereby, the speed of the read-out operation can be increased.

To discriminate a negative threshold, there are cases where a positive potential is applied to the source line SL; and the read-out potential applied to the word line WL is a relatively negative value. In such a case, the potential applied to the source line SL also can be maintained at a constant potential (without being reduced to 0 V) during the WL(n+1) read-out interval and the potential transition interval. In the read-out operation, because the memory cell transistors other than the object cells are in the ON state, the source line SL is connected to the bit lines BL via the NAND strings NS in the case where the object cells are in the ON state. Therefore, even if it is attempted to cause the potential of the bit lines BL to be constant in the WL(n+1) read-out interval and the potential transition interval, if the potential of the source line SL is reduced to 0 V, the potential of the bit lines BL undesirably decreases greatly; and it becomes necessary to recharge the bit lines BL. Conversely, if the potential of the source line SL is maintained at a constant potential, the potential of the bit lines BL also becomes easy to maintain at a constant potential. Thereby, the charging time of the bit lines BL can be shortened; and the read-out operation speed can be increased. To discriminate a negative threshold, there are cases where a positive voltage is applied to the active areas 12 (the well of the memory cells). In such a case as well, the potential of the well can be maintained at a constant potential (without being reduced to 0 V) in the WL(n+1) read-out interval and the potential transition interval.

In NAND flash memory, the time necessary for setting and resetting the word lines and the bit lines is a high proportion of the time necessary for the entire read-out operation. "Setting" refers to the operation of changing the potential to the prescribed potential and stabilizing the potential at the prescribed potential; and "resetting" refers to the operation of initializing by returning the potential to the reference potential (e.g., the ground potential GND). In the embodiment, because the potential that is set in the WL(n+1) read-out interval is utilized in the WLn read-out interval as well, the change amount of the potential, i.e., the charging amount to the interconnects, decreases; and the potential transition interval can be shorter. As a result, the time necessary for the read-out operation can be shortened even further.

In the U page read of the second embodiment described above, the setting and the resetting of the word lines and the bit lines are performed twice each. Conversely, in the embodiment, one setting from the ground potential and one resetting to the ground potential are performed. Otherwise, only a potential change in one direction from the potential that is necessary in the WL(n+1) read-out interval to the potential that is necessary in the WLn read-out interval is used. Therefore, the change amount of the potential is small; and the necessary time is short.

For example, in the embodiment as shown in FIG. 15A, when the ground potential GND is 0 V, the read-out potential C-Read is, for example, 4 V, and the pass potential VREAD_H is, for example, 7 V, it is sufficient to change the potential of the word line WL(n+1) directly prior to the WLn read-out interval only +3 V from the 4 V of the read-out potential C-Read to the 7 V of the pass potential VREAD_H. Conversely, if the potential of the word line WL(n+1) is reset to the ground potential after the end of the WL(n+1) read-out interval, it is necessary to change the potential of the word line WL(n+1) directly prior to the WLn read-out interval +7 V from the 0 V of the ground potential to the 7 V of the pass potential VREAD_H; and the time necessary for the potential change also increases accordingly.

Thus, according to the embodiment, the read-out operation can be even faster than that of the second embodiment described above. On the other hand, in the second embodiment described above, the potentials of the interconnects that are not used are reduced to the ground potential; and the current consumption is low because the charging to the interconnects is stopped during the interval when the potential is the ground potential. Otherwise, the configuration, the operations, and the effects of the embodiment are similar to those of the second embodiment described above.

In the second comparative example described above as shown in FIGS. 11A to 11C, three values are discriminated continuously by continuously applying the read-out potentials A-Read, B-Read, and C-Read of three levels to the word line WL(n+1) in the WL(n+1) read-out interval. In such a case, the reduction effect of the current consumption due to the lockout of the bit lines BL is large. However, in the embodiment, it is discriminated only whether or not the value of the adjacent cell is "C" by applying only the read-out potential C-Read of the one level to the word line WL(n+1) in the WL(n+1) read-out interval. Therefore, even if the lockout of the bit lines BL is performed, the reduction effect of the current consumption is small. Consequently, the advantage of increasing the speed of the read-out operation by stopping the lockout operation of the bit lines BL in the WL(n+1) read-out interval and the potential transition interval is greater.

Although technology is illustrated in the embodiment in which the potential that is set in the WL(n+1) read-out interval is utilized also in the WLn read-out interval for the word lines WL and the bit lines BL, the invention is not limited thereto. For example, the technology described above is applicable similarly to interconnects such as the source line SL shown in FIG. 2, etc. Conversely, the technology described above may be applied only to the interconnects needing time to charge such as the word lines WL, the bit lines BL, etc.

A fourth embodiment will now be described.

The embodiment is an example in which the sequence of the U page read described in the first embodiment described above is applied to the L page read.

Figure 16:
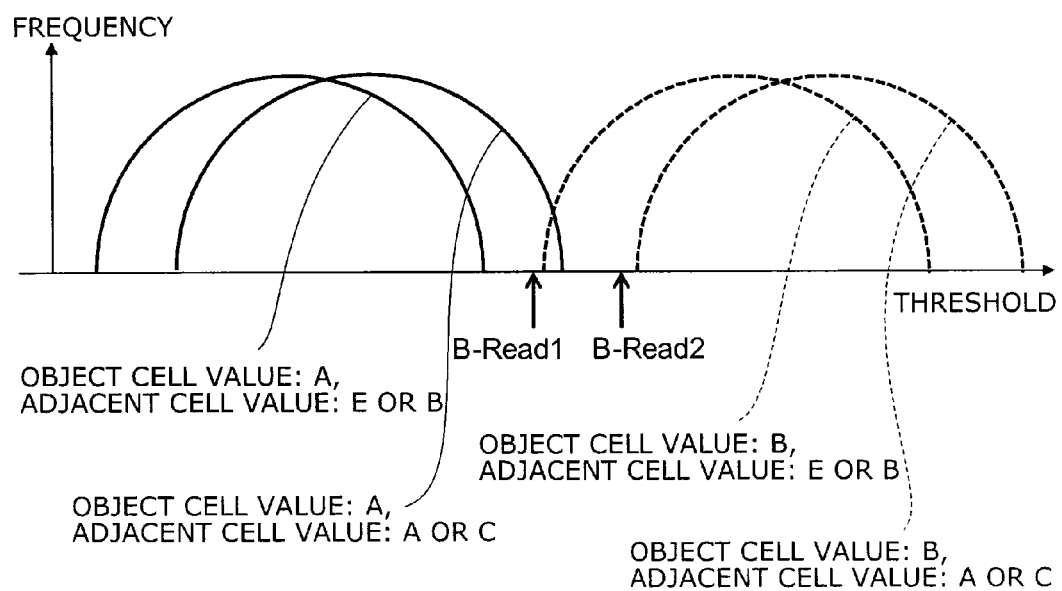
FIG. 16 is a graph showing the fluctuation of the threshold distributions of values "A" and "B"

FIG. 16 is a graph showing the fluctuation of the threshold distributions of values "A" and "B", where the horizontal axis is the thresholds of the memory cell transistors, and the vertical axis is the frequency.

Figure 17A:
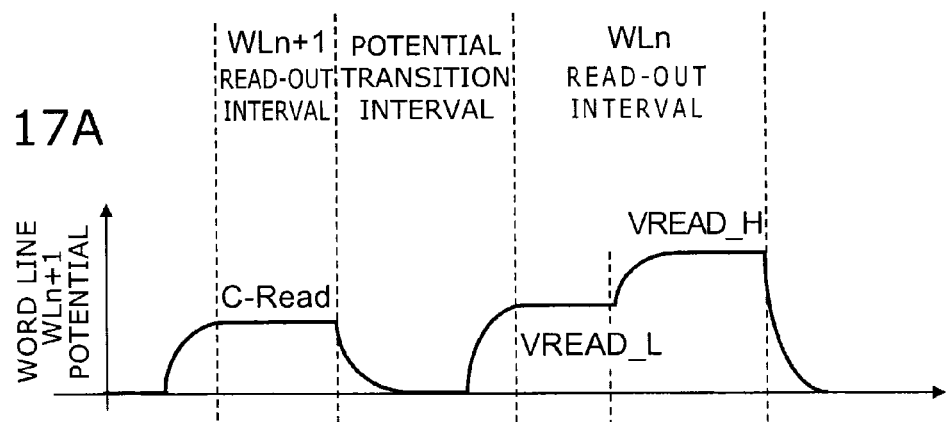
FIGS. 17A to 17C are timing charts showing the operation of an L page read of a forth embodiment.
Figure 17B:
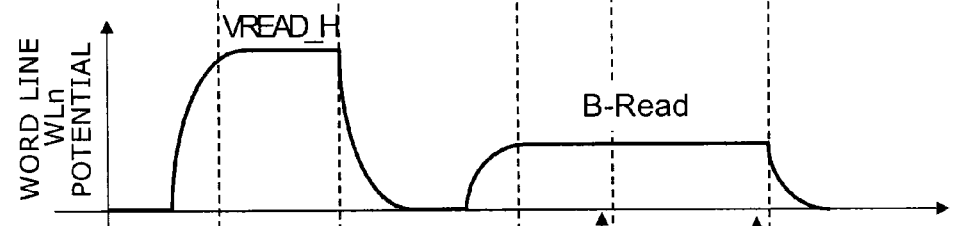
Figure 17C:
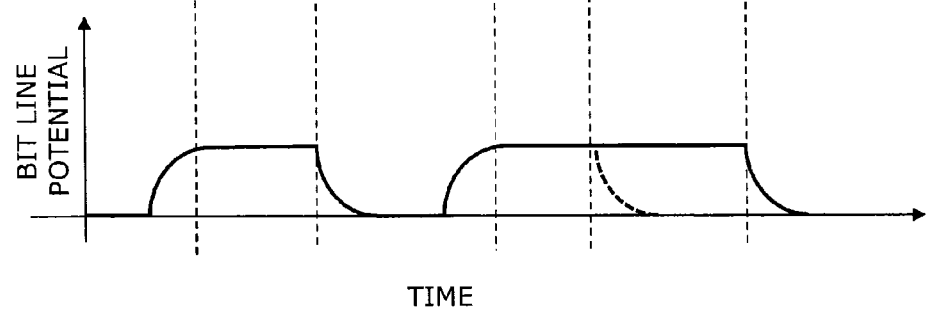

FIGS. 17A to 17C are timing charts showing the operation of an L page read of the embodiment, where the horizontal axis is the time, and the vertical axis is the potentials.

In the L page read as shown in FIG. 6, the read-out potential of the word line WLn is set to B-Read; and it is discriminated whether the values of the object cells are in the first group made of "E" and "A" or in the second group made of "B" and "C". As shown in FIG. 5, the threshold distributions of values "A", "B" and "C" of the object cells fluctuate due to effects of the U page program of the adjacent cells. The fluctuation amount is small when the value of the adjacent cell is "E" or "B", and large when the value of the adjacent cell is "A" or "C". In particular, the fluctuation of the threshold distribution of the object cell increases in the case where the value of the adjacent cell is "C".

As shown in FIG. 16, the shift of the threshold distribution of value "A" and the threshold distribution of value "B" of the object cell in the positive direction is greater for the case where the value of the adjacent cell is "E" than for the case where the value of the adjacent cell is "C". Therefore, in the case where the value of the adjacent cell is "C", the possibility of read-out errors occurring is high when a potential B-Read1 that is suited in the case where the value of the adjacent cell is "E" is applied as the read-out potential of the object cell. In such a case, it is favorable for the reading condition to be modified to a condition corresponding to the case where the read-out potential is a potential B-Read2.

Therefore, in the L page read of the embodiment, first, it is sensed whether or not the value of the adjacent cell is value "C" and then, the discrimination between the first group and the second group of the object cell is performed using the conditions having two levels. Then, if the value of the adjacent cell is "E", "A" or "B", the value read at the condition corresponding to the read-out potential B-Read1 is employed; and if the value of the adjacent cell is "C", the value read at the condition corresponding to the read-out potential B-Read2 is employed.

Specifically, as shown in FIGS. 17A to 17C, first, the values of the adjacent cells are determined by performing the preliminary read-out in the WL(n+1) read-out interval. Namely, the pass potential VREAD_H is applied to the word line WLn; the read-out potential C-Read is applied to the word line WL(n+1) as the preliminary read-out potential; and the prescribed positive potential is applied to the bit lines BL. In this state, the sense amplifiers SA sense the current flowing in the bit lines BL. Then, the latched values of the adjacent cells having the word line WL(n+1) as the control gate electrodes for which a current of the reference value or more flows are stored in the data latches DL of the sense amplifiers SA as "0", and the latched values of the adjacent cells for which a current of the reference value or more does not flow are stored in the data latches DL of the sense amplifiers SA as "1". In such a case, the latched value "0" indicates that the value of the adjacent cell is "E", "A" or "B", and the latched value "1" indicates that the value of the adjacent cell is "C".

Then, in the potential transition interval, the potentials of the word lines WL and the bit lines BL are stepped-down to 0 V. Subsequently, the read-out potential B-Read is applied to the word line WLn; the pass potential VREAD_L is applied to the word line WL(n+1); and the prescribed positive potential is applied to the bit lines BL.

In the WLn read-out interval, the values of the object cells are read using the first condition. Namely, the sense amplifiers SA sense the current flowing in the bit lines BL at time t11 in the state in which the potentials of the interconnects have stabilized at the potentials described above. Then, for the object cells for which the latched value of the adjacent cell is "0", the value of the L page data is caused to be "1" for the object cells for which a current of the reference value or more flows; and the value of the L page data is caused to be "0" for the object cells for which a current of the reference value or more does not flow.

Then, the values of the object cells are read using the second condition. Namely, the potential of the word line WL(n+1) is stepped-up to the pass potential VREAD_H while maintaining the potentials of the word line WLn and the bit lines BL. Thereby, an effect corresponding to the case where the potential of the word line WLn is stepped-up from the potential B-Read1 to the potential B-Read2 is obtained due to the coupling effect. In this state, the sense amplifiers SA sense the current flowing in the bit lines BL at time t12. Then, for the object cells for which the latched value of the adjacent cell is "1", the value of the L page data is caused to be "1" for the object cells for which a current of the reference value or more flows; and the value of the L page data is caused to be "0" for the object cells for which a current of the reference value or more does not flow.

According to the embodiment, in the L page read, the precision of the reading can be increased and the occurrence of read-out errors can be efficiently suppressed while suppressing a large increase of the read-out time. Otherwise, the configuration, the operations, and the effects of the embodiment are similar to those of the first embodiment described above.

A third comparative example will now be described.

Figures 18A, 18B, 18C:
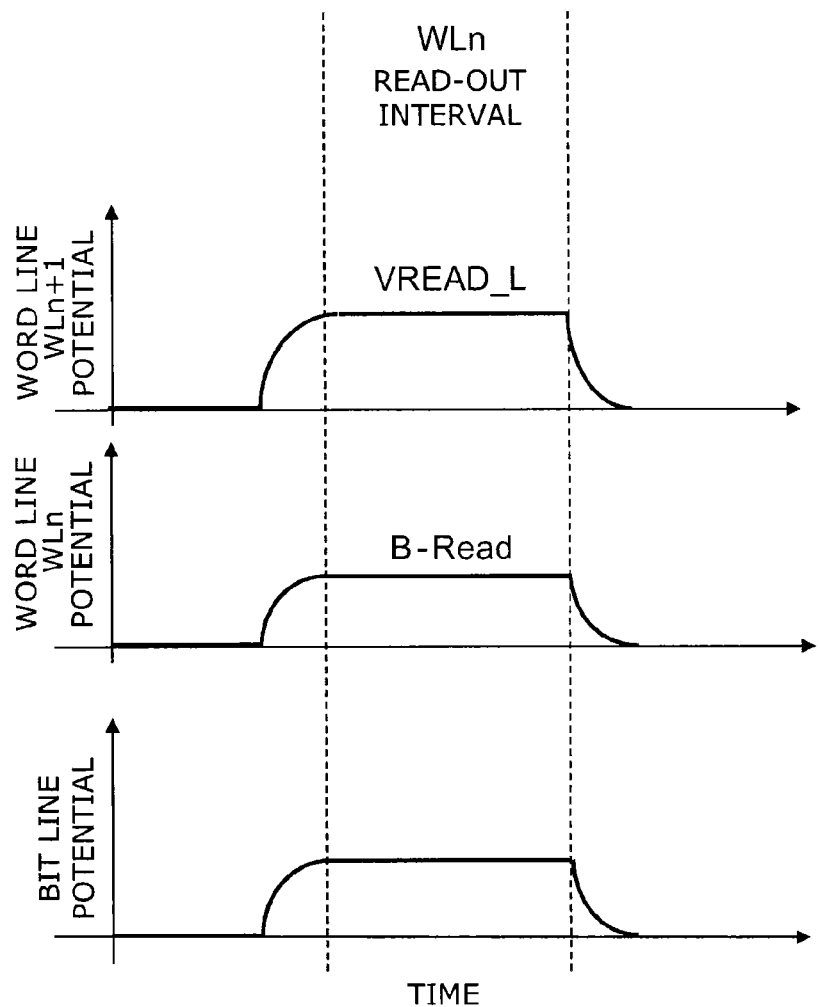
FIGS. 18A to 18C are timing charts showing the operation of an L page read of a third comparative example.

FIGS. 18A to 18C are timing charts showing the operation of an L page read of the comparative example, where the horizontal axis is the time, and the vertical axis is the potentials.

In the L page read of the comparative example as shown in FIGS. 18A to 18C, the potential of the word line WLn which is to be read is set to be the read-out potential B-Read; the potential of the word line WL(n+1) adjacent to the word line WLn is set to be the pass potential VREAD_L; the potential of the bit lines BL are set to be a prescribed positive potential; and the sense amplifiers SA sense the current flowing in the bit lines BL. Then, the value of the L page data is caused to be "1" for the object cells for which a current of the reference value or more flows; and the value of the L page data is caused to be "0" for the object cells for which a current of the reference value or more does not flow.

In the L page read of the comparative example, the discrimination of the values of the object cells is performed using the potential applied to the word line WL(n+1) as a potential having one level without determining the values of the adjacent cells. Therefore, in the case where the shift amount of the threshold distribution is large, the possibility of read-out errors occurring increases.

Conversely, according to the fourth embodiment, the reading condition is modified in the case where the fluctuation amount of the threshold distribution becomes the largest, that is, in the case where the value of the object cell is discriminated and the value of the adjacent cell is "C". Therefore, the precision of the L page reading is high. Because the reading condition is modified only in the case where the value of the adjacent cell is "C", the increase of the time necessary for the read-out operation can be suppressed.

A fifth embodiment will now be described.

The embodiment is an example in which the sequence of the U page read described in the second embodiment described above is applied to the L page read.

Figure 19A:
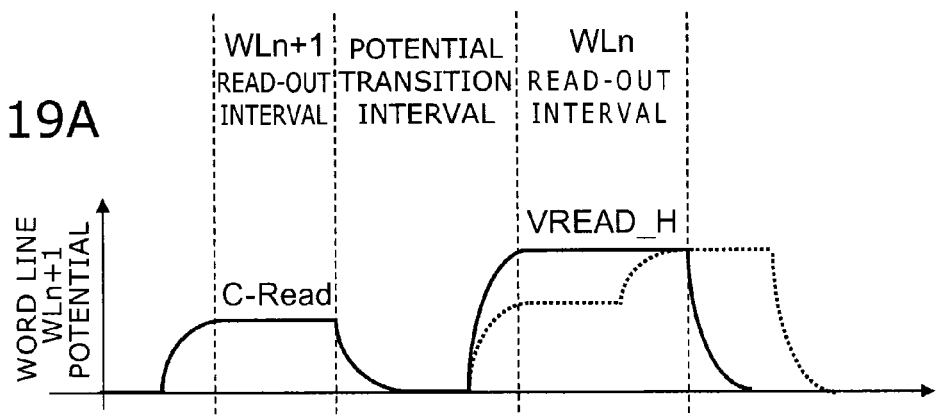
FIGS. 19A to 19C are timing charts showing the operation of an L page read of a fifth embodiment.
Figure 19B:
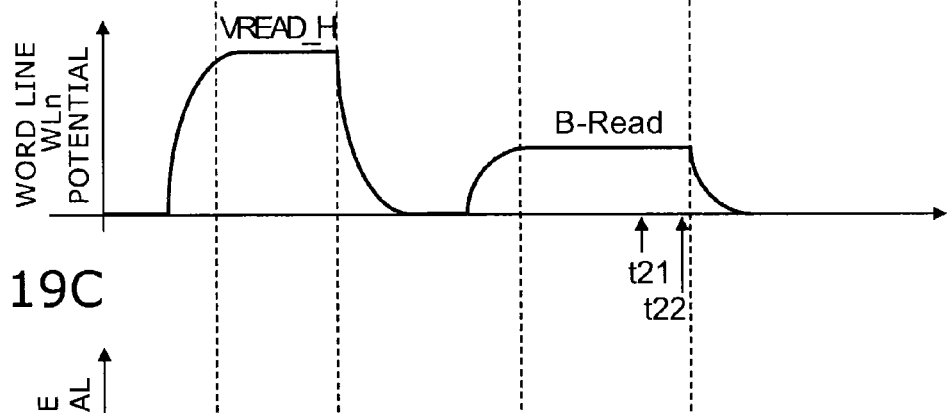
Figure 19C:
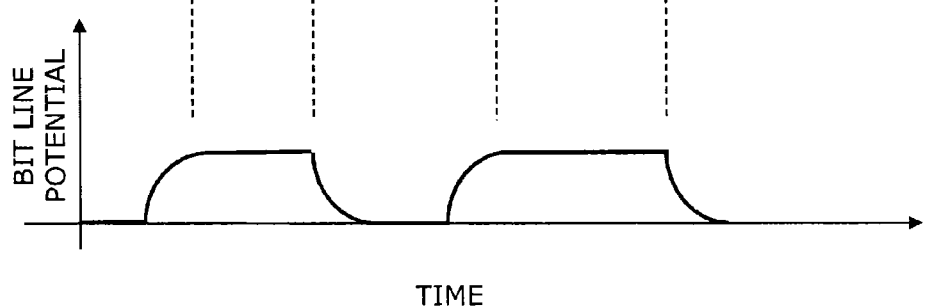

FIGS. 19A to 19C are timing charts showing the operation of an L page read of the embodiment, where the horizontal axis is the time, and the vertical axis is the potentials.

For comparison in FIG. 19A, the potential change (referring to FIG. 17A) of the word line WL(n+1) of the fourth embodiment is illustrated by the broken line.

As shown in FIGS. 19A to 19C, the operation of the WL(n+1) read-out interval of the L page read of the embodiment is similar to that of the fourth embodiment (referring to FIGS. 17A to 17C) described above. In the embodiment, the potential of the word line WL(n+1) is fixed at the pass potential VREAD_H in the WLn read-out interval. Then, a constant amount of charge (a constant charge) is stored in the sense amplifiers SA; the constant charge is caused to flow in the object cells via the bit lines BL; the sensing of the first current is performed at time t21; and the sensing of the second current is performed at time t22. Then, the sensing result at time t21 is employed in the case where the latched value stored in the data latch DL is "0", that is, in the case where the value of the adjacent cell is "E", "A" or "B", and the sensing result at time t22 is employed in the case where the latched value is "1", that is, in the case where the value of the adjacent cell is "C". At the timing of each sensing, the value of the L page data is caused to be "1" for the object cells for which the discharging of the constant charge has ended and the current does not flow; and the value of the L page data is caused to be "0" for the object cells for which the discharging of the constant charge has not ended and the current flows.

According to the embodiment, the precision of the L page read can be increased while suppressing a large increase of the read-out time. Otherwise, the configuration, the operations, and the effects of the embodiment are similar to those of the second embodiment described above.

A sixth embodiment will now be described.

The embodiment is an example in which the sequence of the U page read described in the third embodiment described above is applied to the L page read.

Figure 20A:
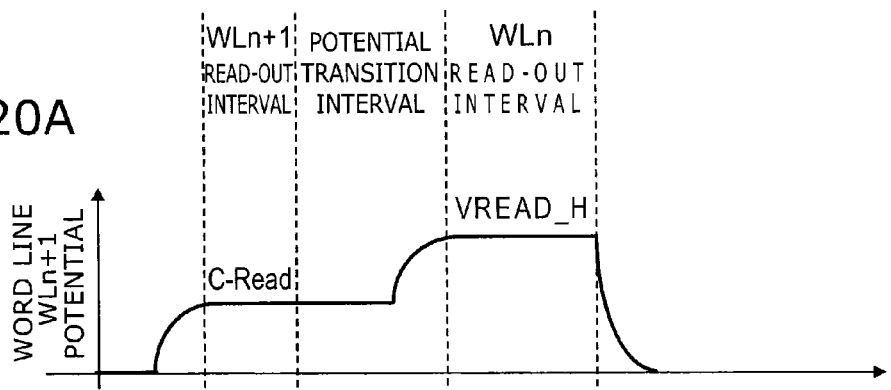
FIGS. 20A to 20C are timing charts showing the operation of an L page read of a sixth embodiment.
Figure 20B:
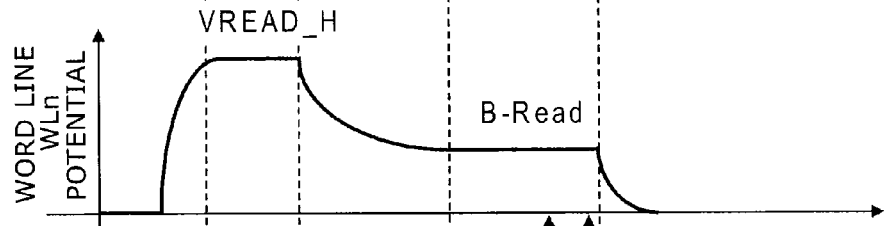
Figure 20C:
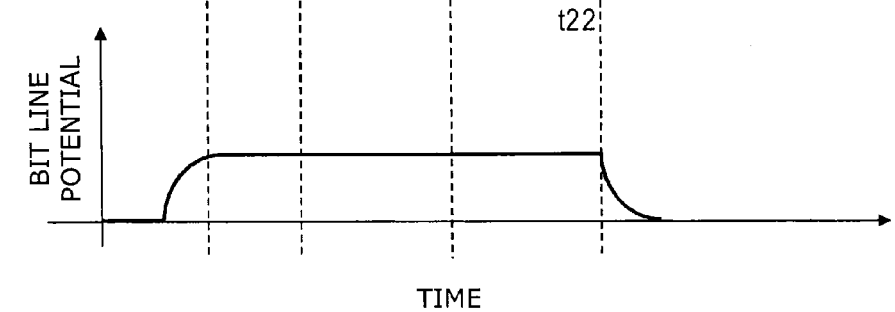

FIGS. 20A to 20C are timing charts showing the operation of an L page read of the embodiment, where the horizontal axis is the time, and the vertical axis is the potentials.

In the L page read of the embodiment as shown in FIGS. 20A to 20C, the potentials of the word lines WL and the bit lines BL are caused to transition between the WL(n+1) read-out interval and the WLn read-out interval without dropping to the ground potential GND. For example, the potentials of the word lines WL and the bit lines BL are changed by monotonously increasing or monotonously decreasing or are maintained at constant values between the WL(n+1) read-out interval and the WLn read-out interval. Thereby, the time necessary for the L page read can be shortened even further. Otherwise, the configuration, the operations, and the effects of the embodiment are similar to those of the third embodiment described above.

An example is illustrated in the embodiments described above in which the preliminary read-out potential, i.e., the potential of the word line WL(n+1) in the WL(n+1) read-out interval, is set to be the potential C-Read, the value of the adjacent cell is discriminated to be "C" or a value other than "C", and the reading condition of the object cell is modified in the case where the value of the adjacent cell is "C", but the preliminary read-out potential is not limited to the potential C-Read. For example, the preliminary read-out potential may be a potential between the potential B-Read and the potential C-Read; and it may be discriminated whether or not the threshold of the adjacent cell is included in the entire threshold distribution of value "C" or in the upper tail of the threshold distribution of value "B". In other words, the preliminary read-out of the adjacent cells is for estimating the fluctuation amount of the thresholds of the object cells; and it is not always necessary to designate the values of the adjacent cells. Accordingly, it is unnecessary for the preliminary read-out potential to be set to be in a valley between the threshold distributions.

Even in the case where the preliminary read-out potential is set to be in the valley between the threshold distributions, the case where the reading condition of the object cell is modified is not limited to the case where the value of the adjacent cell is the highest value. In the case where data having Z values (Z being an integer not less than 3) is stored in the cells, the preliminary read-out potential may be set between the zth threshold distribution from the high side (z being an integer not less than 1 and not more than (Z−1)) and the (z+1)th threshold distribution; and the reading condition of the object cell may be modified in the case where the value of the adjacent cell is one selected from the 1st to zth values from the high side. For example, if Z is 16 and z is 3, the second condition described above is applied in the case where the value of the adjacent cell is, among the 16 values, one selected from the 1st to 3rd values from the high side; and the first condition described above is applied in the case where the value of the adjacent cell is one selected from the 4th to 16th values from the high side.

Although an example is illustrated in the embodiments described above in which data having four levels is divided into the L page data of two levels and the U page data of two levels for each of the memory cell transistors, the levels of the data are not limited to four levels. Values having $2^a$ levels divided into a pages (a being an integer not less than 2) may be programmed to the memory cell transistors. In such a case, the preliminary read-out potential may be a potential between the kth threshold distribution from the low side and the (k+1)th threshold distribution from the low side, where k is an integer smaller than $2^a$, and the threshold distribution having the largest fluctuation amount in the programming is the (k+1)th threshold distribution from the low side for the memory cell transistors after the programming.

Although an example is described in the embodiments described above in which the technology of reading the data by modifying the condition is used in the read-out operation, the technology described above also is applicable to the case where the L page data is read beforehand when programming the U page data.

According to the embodiments described above, a semiconductor memory device having a high-speed read-out operation and high precision of the reading can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:
1. A semiconductor memory device, comprising:
a semiconductor substrate including a plurality of active areas formed in the semiconductor substrate to extend in a first direction;
a plurality of word lines provided on the semiconductor substrate to extend in a second direction;
a plurality of bit lines connected respectively to the active areas;
a source line connected to the plurality of active areas; charge storage layers disposed between the active areas and the word lines; and
a control circuit,
memory cell transistors being formed at intersections between the active areas and the word lines, the memory cell transistors being configured to be programmed with data having values of multiple levels,
the control circuit being configured to apply a pass potential to a first word line and apply a preliminary read-out potential to a second word line coupled with a second memory cell transistor programmed with data after a first memory cell transistor coupled with the first word line is programmed, the pass potential being configured to switch the memory cell transistors to an ON state regardless of the programmed value, the second word line being disposed adjacently to the first word line, the control circuit being configured to read the data from the first memory cell transistor at a first condition in a case where the second memory cell transistor has been switched to the ON state based on a value of the second memory cell transistor by the applying of the preliminary read-out potential, the first condition being configured to enable the discrimination of a value of the first memory cell transistor in a case where the first memory cell transistor has a threshold voltage in a relatively low distribution, the control circuit being configured to read the data from the first memory cell transistor at a second condition in a case where the second memory cell transistor has been switched to an OFF state based on a value of the second memory cell transistor by the applying of the preliminary read-out potential, the second condition being configured to enable the discrimination of a value of the first memory cell transistor in a case where of the first memory cell transistor has a threshold voltage in a relatively high distribution.

2. The device according to claim 1, wherein the preliminary read-out potential is a potential between a threshold distribution of a value having the highest threshold and a threshold distribution of a value having the second highest threshold.

3. The device according to claim 1, wherein values having $2^a$ levels divided into a pages (a being an integer not less than 2) are programmed to the memory cell transistors, and the preliminary read-out potential is a potential between the kth threshold distribution from the low side and the (k+1)th threshold distribution from the low side, where the threshold distribution having the largest fluctuation amount in the programming is the (k+1)th threshold distribution from the low side for the memory cell transistors after the programming, and the k is an integer small than $2^a$.

4. The device according to claim 1, wherein the control circuit causes the potential of the first word line to transition from the pass potential to the potentials applied to the first word line at the first and second conditions without dropping to a ground potential, and the control circuit causes the potential of the second word line to transition from the preliminary read-out potential to the potentials applied to the second word line at the first and second conditions without dropping to the ground potential.

5. The device according to claim 4, wherein the control circuit causes the potential of the bit lines and the potentials of the word lines other than the first and second word lines to transition without dropping to the ground potential in an interval of causing the potential of the second word line to transition from the preliminary read-out potential to the potentials applied to the second word line at the first and second conditions.

6. The device according to claim 5, wherein the control circuit applies a positive voltage to the source line and causes the transitioning without dropping to the ground potential in the interval.

7. The device according to claim 4, wherein the control circuit causes the potential of the first word line to monotonously decrease from the pass potential to the potentials applied to the first word line at the first and second conditions, and the control circuit causes the potential of the second word line to monotonously increase from the preliminary read-out potential to the potentials applied to the second word line at the first and second conditions.

8. The device according to claim 1, wherein values having four levels divided into an upper page and a lower page are not programmed to the memory cell transistors, and in a read-out operation of the upper page, the applying of the preliminary read-out potential to the second word line and the reading of the data from the first memory cell transistor at the first and second conditions are implemented when determining whether the value of the first memory cell transistor is a first value having the lowest threshold distribution or a second value having the second lowest threshold distribution.

9. The device according to claim 1, wherein values having four levels divided into an upper page and a lower page are programmed to the memory cell transistors, and in a read-out operation of the lower page, the applying of the preliminary read-out potential to the second word line and the reading of the data from the first memory cell transistor at the first and second conditions are implemented when determining whether the value of the first memory cell transistor is in a first group made of a first value having the lowest threshold distribution and a second value having the second lowest threshold distribution or in a second group made of a third value having the third lowest threshold distribution and a fourth value having the highest threshold distribution.

10. The device according to claim 1, wherein it is discriminated whether the value stored in the first memory cell transistor is the value having the lowest threshold or a value other than the value having the lowest threshold when reading the data from the first memory cell transistor at the first and second conditions.

11. The device according to claim 1, wherein the potential applied to the second word line at the second condition is higher than the potential applied to the second word line at the first condition.

12. The device according to claim 1, wherein at the first condition, it is determined whether or not a constant amount of charge has been discharged via the first memory cell transistor after a first time has elapsed from when a current started to flow in the first memory cell transistor, and at the second condition, it is determined whether or not the constant amount of charge has been discharged via the first memory cell transistor after a second time has elapsed from when the current started to flow in the first memory cell transistor, the second time being longer than the first time.

13. The device according to claim 1, wherein values having four levels are programmed to the memory cell transistors, it is determined whether the value of the first memory cell transistor is in a first group made of a first value having the second lowest threshold distribution or in a second group made of a third value having the third lowest threshold distribution and a fourth value having the highest threshold distribution, and subsequently, it is determined whether the value of the first memory cell transistor is the first value or the second to fourth values and whether the value of the first memory cell transistor is the first to third values or the fourth value, and the applying of the preliminary read-out potential to the second word line and the reading of the data from the first memory cell transistor at the first and second conditions are implemented when determining whether the value of the first memory cell transistor is the first value or the second value.

14. The device according to claim 1, wherein
values having four levels are programmed to the memory cell transistors,
it is determined whether the value of the first memory cell transistor is in a first group made of a first value having the lowest threshold distribution and a second value having the second lowest threshold distribution or in a second group made of a third value having the third lowest threshold distribution and a fourth value having the highest threshold distribution, and subsequently, it is determined whether the value of the first memory cell transistor is the first value or the second to fourth values and whether the value of the first memory cell transistor is the first to third values or the fourth value, and
the applying of the preliminary read-out potential to the second word line and the reading of the data from the first memory cell transistor at the first and second conditions are implemented when determining whether the value of the first memory cell transistor is in the first group or in the second group.

15. The device according to claim 1, wherein, when programming the data to the memory cell transistors each having a first value having the lowest threshold,
a medium value is programmed to a portion of a plurality of the memory cell transistors sharing the first word line,
the medium value is programmed to a portion of a plurality of the memory cell transistors sharing the second word line, and
a second value having a threshold higher than the threshold of the first value is programmed to a portion of the plurality of memory cell transistors sharing the first word line and having values of the first value, a third value having a threshold higher than the threshold of the second value is programmed to a portion of the plurality of memory cell transistors sharing the first word line and programmed with the medium value, and a fourth value having a threshold higher than the threshold of the third value is programmed to the remaining memory cell transistors of the plurality of memory cell transistors sharing the first word line and programmed with the medium value.

* * * * *